United States Patent
Hase

(10) Patent No.: US 7,723,176 B2
(45) Date of Patent: May 25, 2010

(54) METHOD FOR MANUFACTURING SEMICONDUCTOR DEVICE

(75) Inventor: Takashi Hase, Tokyo (JP)

(73) Assignee: NEC Corporation, Tokyo (JP)

( * ) Notice: Subject to any disclaimer, the term of this patent is extended or adjusted under 35 U.S.C. 154(b) by 273 days.

(21) Appl. No.: 11/990,464

(22) PCT Filed: Aug. 29, 2006

(86) PCT No.: PCT/JP2006/316945
§ 371 (c)(1),
(2), (4) Date: Feb. 14, 2008

(87) PCT Pub. No.: WO2007/026677
PCT Pub. Date: Mar. 8, 2007

(65) Prior Publication Data
US 2009/0221116 A1    Sep. 3, 2009

(30) Foreign Application Priority Data
Sep. 1, 2005    (JP) .............. 2005-253326

(51) Int. Cl.
H01L 21/8238    (2006.01)
H01L 21/3205    (2006.01)
H01L 21/4763    (2006.01)
H01L 21/44    (2006.01)

(52) U.S. Cl. .............. 438/218; 438/592; 438/585; 438/655

(58) Field of Classification Search .......... 438/197, 438/585, 587, 664, 218, 299, 592, 581, 583, 438/682, 649, 651, 655, 663
See application file for complete search history.

(56) References Cited

U.S. PATENT DOCUMENTS 5,972,785 A    10/1999    Shishiguchi et al.
7,573,106 B2*    8/2009    Saito ..................... 257/377

(Continued)

FOREIGN PATENT DOCUMENTS

JP    4-299825    10/1992

(Continued)

OTHER PUBLICATIONS

Jakub Kedzierski, et al., "Threshold voltage control in NiSi-gated MOSFETs through silicidation induced impurity segregation (SIIS)", Electron Devices Meeting, 2003. IEDM apos; 03 Technical Digest. IEEE International Volume, Issue, Dec. 8-10, 2003 pp. 315-318.

(Continued)

*Primary Examiner*—Chuong A. Luu
(74) *Attorney, Agent, or Firm*—McGinn IP Law Group, PLLC

(57) ABSTRACT

Element characteristics disadvantageously fluctuate because the composition of the resultant silicide varies according to the change of the gate length when a full silicide gate electrode is formed by sintering a metal/poly-Si structure. The element characteristics also fluctuate due to element-to-element non-uniformity of the resultant silicide composition. By first forming full silicide having a metal-rich composition, depositing a Si layer thereon, and sintering the combined structure, the metal in the metal-rich silicide diffuses into the Si layer, so that the Si layer is converted into silicide. The entire structure thus is converted into full silicide having a smaller metal composition ratio.

32 Claims, 9 Drawing Sheets

U.S. PATENT DOCUMENTS

| | | |
|---|---|---|
| 2001/0003056 A1 | 6/2001 | Hashimoto et al. |
| 2005/0051845 A1 | 3/2005 | Nakagawa et al. |
| 2005/0127451 A1 | 6/2005 | Tsuchiya et al. |
| 2005/0199963 A1* | 9/2005 | Aoyama .................. 257/369 |

FOREIGN PATENT DOCUMENTS

| | | |
|---|---|---|
| JP | 10-125909 | 5/1998 |
| JP | 2001-168059 | 6/2001 |
| JP | 2002-299282 | 10/2002 |
| JP | 2005-85949 | 3/2005 |
| JP | 2005-129551 | 5/2005 |
| JP | 2005-150267 | 6/2005 |
| JP | 2005-150752 | 6/2005 |
| JP | 2005-191545 | 7/2005 |
| WO | WO 2007/139041 A1 | 12/2007 |

OTHER PUBLICATIONS

Jakub Kedzierski, et al., "Metal-gate FinFET and fully-depleted SOI devices using total gate silicidation", Electron Devices Meeting, 2002. IEDM apos; 02 Digest. International Volume, Issue, 2002 pp. 247-250.

Kensuke Takahashi, et al., "Dual Workfunction Ni-Silicide/HfSiON Gate Stacks by Phase-Controlled Full-Silicidation (PC-FUSI) Technique for 45nm-node LSTP and LOP Devices", Electron Devices Meeting, 2004. IEDM Technical Digest. IEEE International Volume, Issue, Dec. 13-15, 2004 pp. 91-94.

Kittl, et al., "Scalability of Ni FUSI gate processes; phase and Vt control to 30 nm gate lengths", 2005 Symposium on VLSI Technology Digest of Technical Papers.

* cited by examiner

US 7,723,176 B2

METHOD FOR MANUFACTURING SEMICONDUCTOR DEVICE

TECHNICAL FIELD

The present invention relates to a method for manufacturing a semiconductor device, particularly to a method for manufacturing a semiconductor device including a high dielectric constant insulating film, more particularly to a technology for improving the reliability and yield of a MOSFET (Metal Insulator Semiconductor Field Effect Transistor).

BACKGROUND ART

In the development of a leading end CMOS (Complementary MOS) device in which the size of the transistor is getting smaller, there have been problems of degradation of the drive current due to depletion in the gate electrode made of polysilicon (poly-Si) and increase in gate leak current due to reduction in thickness of the gate insulating film. To address these problems, a hybrid technology has been investigated, in which a metal gate electrode is used to prevent the depletion in the electrode and the gate leak current is reduced by using a high dielectric constant material for the gate insulating film to increase the physical film thickness.

As the material used for the metal gate electrode, pure metals, metal nitrides, silicide materials and the like have been investigated. In any of the cases, however, the threshold voltages ($V_{th}$) of the n-type MOS transistor (hereinafter referred to as "nMOS") and the p-type MOS transistor (hereinafter referred to as "pMOS") need to be set to appropriate values.

To achieve a $V_{th}$ value smaller than or equal to ±0.5 eV in a CMOS transistor, the gate electrode in the nMOS needs to be made of the material having an effective work function smaller than or equal to the mid-gap of Si (4.6 eV), desirably smaller than or equal to 4.4 eV. Similarly, the gate electrode in the nMOS needs to be made of the material having an effective work function greater than or equal to the mid-gap of Si (4.6 eV), desirably greater than or equal to 4.8 eV.

To achieve the above requirements, there has been proposed a method for controlling the $V_{th}$ values of the transistors by separately using silicide electrodes having the same metal composition but containing different impurities as the gate electrodes in the nMOS and pMOS (dual-metal gate technology). For example, International electron device meeting technical digest, 2002, p. 247 and International electron device meeting technical digest, 2003, p. 315 disclose devices using gate insulating films made of $SiO_2$ and Ni silicide gate electrodes (P-doped NiSi and B-doped NiSi) obtained by silicidation of the entire poly-Si electrodes (polysilicon electrodes) into which impurities, such as P and B, are implanted, using Ni. These references state that the effective work function of each of the gate electrodes is modulated by 0.5 eV at the maximum. The disclosed technology is characterized in that a poly-Si electrode can be silicided after high-temperature heat treatment for activating impurities in the source/drain diffusion regions of the CMOS transistor. There is thus provided an advantage of being highly compatible with the CMOS process of related art.

Further, International electron device meeting technical digest, 2004, p. 91 proposes a technology for controlling the $V_{th}$ values of the transistors by separately using Ni silicide electrodes having different compositions as the gate electrodes in the nMOS and pMOS. In this technology, an $NiSi_2$ electrode or an NiSi electrode is used for the nMOS and an $Ni_3Si$ electrode is used for the pMOS so that the effective work function can be modulated by 0.4 eV at the maximum even on HfSiON, which is a high dielectric constant gate insulating film. This technology provides advantages of being highly compatible with the CMOS process of related art and being applicable to an HfSiON gate insulating film.

Further, a solution has been investigated to eliminate the problem of unintentional change of the composition of the NiSi electrode to a Ni-rich composition when the gate length of the semiconductor device is short. In the method described in Symposium on VLSI Technology technical digest, 2005, p. 72, a reaction is initiated between part of poly-Si, which later becomes the gate electrode, and Ni at a low temperature lower than or equal to 300° C. (first sintering process) to first form an $Ni_2Si$/poly-Si stacked structure. Then, the Ni metal that has not reacted is removed, and heat treatment at a higher temperature (second sintering process) is carried out to convert the portion of the gate electrode that is in contact with the gate insulating film into NiSi. A full-silicide electrode manufacturing technology is disclosed in the above two-step sintering process.

In this technology, the temperature and time in the first sintering process are adjusted to achieve the state in which the $Ni_2Si$ layer 21 containing Ni equal to or more than amount corresponding to Ni necessary to convert the entire gate electrode into NiSi is stacked on part of the remaining gate poly-Si 4 that has not reacted (FIG. 2(a)). This technology is also characterized in that a reaction is initiated between the $Ni_2Si$ layer 21 and the remaining poly-Si 4 in the second higher-temperature sintering process so as to convert at least the portion in contact with the gate insulating film into NiSi 15 (FIG. 2(b)). In the above process, the thickness of the $Ni_2Si$ film is determined independent of the geometry, such as the gate length, but only by the temperature and time in the first sintering process, so that it is possible to prevent the phenomenon in which the composition of the NiSi electrode unintentionally changes to a Ni-rich composition when the gate length is short.

As described above, the full-silicide metal gate electrode has a controllable effective work function and high compatibility with the CMOS process of relate art, and is applicable onto HfSiON, which is a high dielectric constant gate insulating film. The full silicide metal gate electrode has many advantages which makes it also possible to eliminate the gate length-dependent instability of the NiSi composition (change of the NiSi composition from a desired stoichiometric composition).

The two-step sintering process for eliminating the gate length-dependent instability of the NiSi composition, however, has the following major problems. First, the process margin for temperature and time is small because it is necessary to control the sintering temperature and time to control the thickness of the $Ni_2Si$ film formed in the first sintering process. As for the margin for temperature, in particular, the variation in thickness of the $Ni_2Si$ film is approximately as large as 20 to 30 nm when the variation in temperature is on the order of 20° C., as described in Symposium on VLSI Technology technical digest, 2005, p. 72. Such variation in film thickness causes variation in element characteristics. Further, as described in the above reference, the interface between the $Ni_2Si$ formed in the first sintering process and the poly-Si that has not reacted is not be a flat surface, resulting in generating irregularities ranging from 30 to 50 nm (FIG. 2(c)).

In such circumstances, particularly when the gate length is short, depending on the degree of the irregularities, poly-Si that has not reacted is left after the second sintering process, or no poly-Si that has not reacted is left in the first sintering process and the entire structure is converted into Ni$_2$Si. In either case, the element characteristics could significantly varies.

The variation in element characteristics is particularly significant when the initial height of poly-Si for forming the gate electrode is low. For example, when the initial height of poly-Si for forming the gate electrode is 100 nm, the target thickness values of the Ni$_2$Si film and the remaining poly-Si film that has not reacted need to be 75 to 150 nm and 50 nm or smaller, respectively. However, it is difficult to control the thickness of the remaining poly-Si film to be 50 nm or smaller by taking into consideration of the combined effect of the variation in temperature and the degree of the interface irregularities.

Such problems occur not only when a semiconductor device with an nMOS and a pMOS is manufactured but also when a semiconductor device with only an nMOS or a pMOS is manufactured.

DISCLOSURE OF THE INVENTION

The present invention has been made to solve the above problems of the related art. An object of the present invention is to solve the above problems and provide a method for manufacturing a semiconductor device capable of improving the reproducibility and reliability of the element.

[1] A method for manufacturing a semiconductor device with a MOS transistor, wherein the method comprises:

a formation step of forming a gate insulating film, a first region made of a component S1, and a mask in this order in such a way that the gate insulating film, the first region, and the mask jut out from a semiconductor layer;

a step of providing gate sidewalls on both sides of the gate insulating film, the first region, and the mask;

a step of forming source/drain regions in the semiconductor layer on both sides of the first region;

an exposing step of exposing the first region by removing the mask;

a first deposition step of depositing a metal layer at least on the exposed first region, the metal layer containing an amount of metal M1 more than an amount of metal M1 necessary to react to all the component S1 in the first region to form a first alloy made of a crystalline phase expressed by M1$_{x1}$S1$_{y1}$ (x1 and y1 are natural numbers);

a first alloying step of converting the entire first region into a region (1) made of the first alloy through a reaction between the component S1 in the first region and the metal M1 using heat treatment;

a step of removing the metal layer containing the metal M1 that has not reacted with the component S1 in the first alloying step;

a second deposition step of depositing a second region in such a way that the second region comes into contact with at least part of the region (1), the second region containing an amount of component S1 more than an amount of component S1 necessary to react to all the first alloy to form a second alloy made of a crystalline phase expressed by M1$_{x2}$S1$_{y2}$ (x2 and y2 are natural numbers, y2/x2>y1/x1);

a second alloying step of converting the entire region (1) into a region (2) made of the second alloy to form a gate electrode through a reaction between the component S1 in the second region and the first alloy by using heat treatment; and a step of removing the second region made of the component S1 that has not reacted with the first alloy in the second alloying step.

[2] A method for manufacturing a semiconductor device with an n-type MOS transistor and a p-type MOS transistor, wherein the method comprises:

a step of preparing a semiconductor layer including an n-type semiconductor region and a p-type semiconductor region insulatively spaced from each other with an isolation region therebetween;

a formation step of forming a gate insulating film, a first region made of a component S1, and a mask in this order in such a way that the gate insulating film, the first region, and the mask jut out from the n-type semiconductor region, and forming a gate insulating film, a first region made of a component S1, and a mask in this order in such a way that the gate insulating film, the first region, and the mask jut out from the p-type semiconductor region;

a step of providing gate sidewalls on both sides of the gate insulating film, the first region, and the mask that jut out from the n-type semiconductor region, and on both sides of the gate insulating film, the first region, and the mask that jut out from the p-type semiconductor region;

a step of forming source/drain regions in the n-type semiconductor region on both sides of the first region and in the p-type semiconductor region on both sides of the first region, respectively;

an exposing step of exposing first regions that jut out from the n-type semiconductor region and the p-type semiconductor region by removing masks;

a first deposition step of depositing metal layer at least on the exposed first regions, the metal layer containing an amount of metal M1 more than an amount of metal M1 necessary to react to all the component S1 in the first regions to form a first alloy made of a crystalline phase expressed by M1$_{x1}$S1$_{y1}$ (x1 and y1 are natural numbers);

a first alloying step of converting the entire first regions, which jut out from the n-type semiconductor region and the p-type semiconductor region, into regions (1) made of the first alloy through a reaction between the component S1 in the first regions and the metal M1 by using heat treatment;

a step of removing the metal layer containing the metal M1 that has not reacted with the component S1 in the first alloying step so as to expose the regions (1);

a step of forming a cap film to cover the exposed portion of the region (1) jutting out from the n-type semiconductor region;

a second deposition step of depositing a second region in such a way that the second region comes into contact with at least part of the region (1) jutting out from the p-type semiconductor region, the second region containing an amount of component S1 more than an amount of component S1 necessary to react to all the first alloy in the region (1) jutting out from the p-type semiconductor region to form a second alloy made of a crystalline phase expressed by M1$_{x2}$S2$_{y2}$ (x2 and y2 are natural numbers, y2/x2>y1/x1);

a second alloying step of converting the entire region (1), which juts out from the p-type semiconductor region, into a region (2) made of the second alloy so as to form a gate electrode through a reaction between the component S1 in the second region and the first alloy by using heat treatment; and a step of removing the second region made of the component S1 that has not reacted with the first alloy in the second alloying step.

[3] The method for manufacturing a semiconductor device as described in [1] or [2], wherein the gate sidewalls are not removed but left in the exposing step of exposing the first region; and the thicknesses of the first region and the mask are selected in the formation step, the composition of the first alloy is selected in the first deposition step and the first alloying step, and the composition of the second alloy is selected in the second deposition step and the second alloying step in such a way that the top surface of the gate electrode is set to a level lower than the top portions of the gate sidewalls.

[4] The method for manufacturing a semiconductor device as described in any of [1] to [3], wherein the gate insulating film contains Hf.

[5] The method for manufacturing a semiconductor device as described in [4], wherein the gate insulating film contains HfSiON.

[6] The method for manufacturing a semiconductor device as described in any of [1] to [5], wherein the component S1 is Si or Si containing impurities.

[7] The method for manufacturing a semiconductor device as described in any of [1] to [5], wherein the component S1 is $Si_zGe_{1-z}$ ($0<z<1$) or $Si_zGe_{1-z}$ ($0<z<1$) containing impurities.

[8] The method for manufacturing a semiconductor device as described in any of [1] to [7], wherein the metal M1 is Ni.

[9] The method for manufacturing a semiconductor device as described in any of [1] to [5], wherein
the first region made of Si is formed is in the formation step,
an Ni layer having a thickness greater than 1.7 times the thickness of the first region is deposited as the metal layer in the first deposition step, and
the $Ni_3Si$ crystalline phase is formed as the first alloy in the first alloying step by carrying out the heat treatment in which the first region and the metal layer are heated to a temperature ranging from 350 to 650° C.

[10] The method for manufacturing a semiconductor device as described in any of [1] to [5], wherein
the first region made of Si is formed is in the formation step,
an Ni layer having a thickness greater than 1.1 times the thickness of the first region is deposited as the metal layer in the first deposition step, and
the $Ni_2Si$ crystalline phase is formed as the first alloy in the first alloying step by carrying out the heat treatment in which the first region and the metal layer are heated to a temperature ranging from 240 to 300° C.

[11] The method for manufacturing a semiconductor device as described in [9], wherein
the second region made of Si and having a thickness greater than twice the thickness of the first region is deposited in such a way that the second region comes into contact with the entire exposed portion of the region (1) in the second deposition step, and
the NiSi crystalline phase is formed as the second alloy in the second alloying step by carrying out the heat treatment in which the second region and the region (1) are heated to a temperature ranging from 350 to 550° C.

[12] The method for manufacturing a semiconductor device as described in [10], wherein
the second region made of Si and having a thickness greater than the thickness of the first region is deposited in such a way the second region comes into contact with the entire exposed portion of the region (1) in the second deposition step, and
the NiSi crystalline phase is formed as the second alloy in the second alloying step by carrying out the heat treatment in which the second region and the region (1) are heated to a temperature ranging from 350 to 550° C.

[13] The method for manufacturing a semiconductor device as described in [9], wherein
the second region made of Si and having a thickness greater than five times the thickness of the first region is deposited in such a way that the second region comes into contact with the entire exposed portion of the region (1) in the second deposition step, and
the $NiSi_2$ crystalline phase is formed as the second alloy in the second alloying step by carrying out the heat treatment in which the second region and the region (1) are heated to a temperature ranging from 650 to 800° C.

[14] The method for manufacturing a semiconductor device as described in [10], wherein
the second region made of Si and having a thickness greater than twice the thickness of the first region is deposited in such a way that the second region comes into contact with the entire exposed portion of the region (1) in the second deposition step, and
the $NiSi_2$ crystalline phase is formed as the second alloy in the second alloying step by carrying out the heat treatment in which the second region and the region (1) are heated to a temperature ranging from 650 to 800° C.

[15] The method for manufacturing a semiconductor device as described in any of [1] to [7],
wherein the method further comprises the step of forming nickel silicide layers on the source/drain regions after the step of forming the source/drain regions,
the metal layer is deposited at 450° C. or lower in the first deposition step,
the second region is deposited at 450° C. or lower in the second deposition step, and
the heat treatment is carried out at 450° C. or lower in the first and second alloying steps.

[16] The method for manufacturing a semiconductor device as described in [15], wherein the second region is deposited by using sputtering in the second deposition step.

[17] The method for manufacturing a semiconductor device as described in any of [1] to [7],
wherein the method further comprises the step of forming cobalt silicide layers or titanium silicide layers on the source/drain regions after the step of forming the source/drain regions,
the metal layer is deposited at 800° C. or lower in the first deposition step,
the second region is deposited at 800° C. or lower in the second deposition step, and
the heat treatment is carried out at 800° C. or lower in the first and second alloying steps.

| Description of Symbols | |
|---|---|
| 1 | silicon substrate |
| 2 | isolation region |
| 3 | gate insulating film |
| 4 | poly-Si film |
| 5 | silicon oxide film |
| 6 | extension diffusion layer region |
| 7 | gate sidewall |
| 8 | source/drain diffusion region |
| 9 | Ni (source/drain silicide metal) film |
| 10 | silicide layer |
| 11 | interlayer insulating oxide film |
| 12 | Ni (gate electrode silicide metal) film |
| 13 | Ni$_3$Si or Ni$_2$Si electrode (silicide having a metal-rich composition) |
| 14 | additional silicon layer |
| 15 | NiSi or NiSi$_2$ electrode (silicide having a Si-rich composition) |
| 16 | interlayer insulating film |
| 17 | contact plug |
| 21 | Ni$_2$Si electrode |
| 25 | silicon nitride film |
| 31 | reaction barrier layer |
| 111 | interlayer insulating nitride film |

BEST MODE FOR CARRYING OUT THE INVENTION

The present invention relates to a method for manufacturing a semiconductor device with a MOS transistor (hereinafter referred to as "MOS"), the MOS transistor including a gate electrode made of an alloy of a component (Si, for example) and a metal, being uniform, and having excellent element characteristics. The present invention also relates to a method for manufacturing a semiconductor device with an nMOS and a pMOS, the gate electrode of the nMOS having a high content of a component (S1), the gate electrode of the pMOS having a high content of a metal. The key of the present invention is a process for fabricating a transistor with the gate electrode having a high content of the component S1, and the process is carried out in such a way that an alloy having a high content of a metal is first formed and then an additional amount of the component S1 is deposited to initiate a reaction between the alloy and the component S1 so as to increase the content of the component S1 in the gate electrode.

(Operation)

Figure 1:
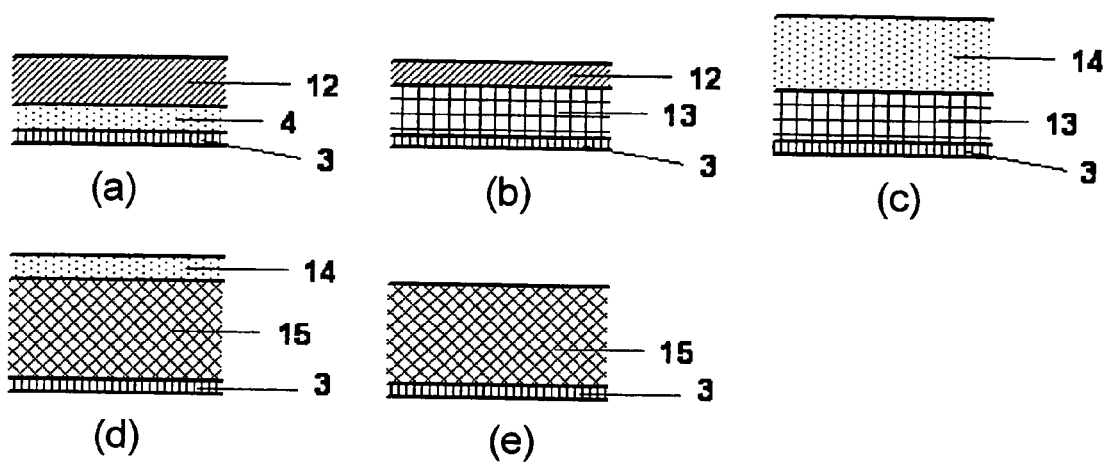
FIG. 1 is a conceptual view showing the method for manufacturing a semiconductor device of the present invention.
Figure 2:
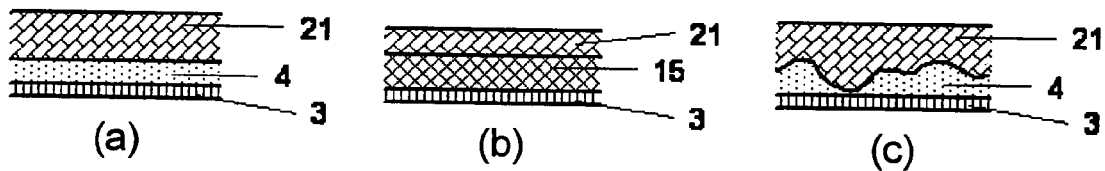
FIG. 2 is a conceptual view showing an exemplary method for manufacturing a semiconductor device of related art.

The following description will be made, for example, with reference to Ni silicide (Si is used as the component S1 and Ni is used as the metal M1). In this case, a gate electrode material made of the Ni$_3$Si crystalline phase, which is an Ni-rich composition, is formed, and then a silicon film is deposited thereon to react the silicon film with the Ni$_3$Si crystalline phase so as to eventually form an NiSi crystalline phase gate electrode. The process for thus forming the gate electrode through two separate alloying stages will be described below with reference to FIG. 1.

As shown in FIG. 1(a), an Ni layer is deposited on a silicon film in such a way that the film thickness of the Ni layer is 1.7 times or more the thickness of the underlying silicon film, and the silicidation is conducted at a temperature approximately ranging from 350 to 650° C. The silicon film is thus converted into an Ni$_3$Si (first alloy) film. The number of Ni atoms contained in the Ni layer, the film thickness of which is 1.7 times or more the thickness of the underlying silicon film, is three times or more the number of silicon atoms in the underlying silicon film. When the Ni layer containing Ni atoms three times or more the silicon atoms in the underlying silicon film is thus supplied, the Ni$_3$Si crystalline phase is formed because it is the stable phase in the above temperature range. Once the entire silicon is converted into the Ni$_3$Si crystalline phase, the reaction will no longer proceed, and the excess Ni that has not reacted with silicon is left as metallic Ni above the Ni$_3$Si film (FIG. 1(b)). The composition ratio of the resultant Ni$_3$Si film is determined to be approximately Ni/Si=3/1, so that an Ni$_3$Si crystalline phase having a fixed composition can be formed under a significantly broad silicidation condition that the thickness of Ni film is 1.7 times or more the thickness of the silicon film and the silicidation sintering temperature ranges from 350 to 650° C.

Then, the excess Ni that has not reacted with silicon is selectively removed, and an additional silicon layer (second region) containing silicon atoms twice or more the silicon atoms in the initial underlying silicon film is deposited on the Ni$_3$Si film (FIG. 1(c)). The reason why the amount of additional silicon is twice or more the amount silicon in the underlying silicon film is that the total number of Si atoms in the additional silicon and the Ni$_3$Si crystalline phase needs to be greater than or equal to the total number of Ni atoms therein. If the amount of additional silicon is less than or equal to twice the amount of silicon in the underlying silicon film, only the upper portion of the Ni$_3$Si crystalline phase is converted into NiSi, whereas the lower portion remains as the Ni$_3$Si crystalline phase. NiSi silicidation is thus not fully achieved.

When heat treatment is carried out to the structure shown in FIG. 1(c) at a temperature approximately ranging from 350 to 550° C., Ni in the Ni$_3$Si crystalline phase diffuses into the additional silicon layer, so that Ni in the composition of the Ni$_3$Si crystalline phase region decreases and the additional silicon layer is converted into Ni silicide. When the amount of Ni to be supplied is not enough with respect to the amount of existing Si to form Ni$_3$Si, the NiSi crystalline phase is the stable crystalline phase in this temperature range. The diffusion and the silicidation reaction automatically stop when the entire Ni$_3$Si crystalline phase has become the NiSi crystalline phase. The excess Si does not contribute to the reaction and is left above the NiSi crystalline phase (FIG. 1(d)). The composition ratio of the resultant NiSi crystalline phase is determined to be approximately Ni/Si=1/1, so that an NiSi crystalline phase having a fixed composition can be formed under a significantly broad silicidation condition that the thickness of the additional Si film is twice or more the thickness of the initial silicon film and the silicidation sintering temperature ranges from 350 to 550° C. Finally, only the excess Si is selectively wet-etched (FIG. 1(e)).

As described above, in both the steps of forming the Ni$_3$Si crystalline phase (first alloying process) and forming the NiSi crystalline phase (second alloying process), the composition is automatically determined and the reaction automatically stops. Therefore, the composition of the resultant silicide can advantageously be determined independent of geometric factors, such as the gate length.

Such a process in which the alloy composition is automatically determined has significantly wide margins in the operation conditions at the same time. Specifically, there are significantly wide margins for the following parameters: the Ni film thickness and the silicidation temperature for fabricating the Ni$_3$Si crystalline phase, and the additional Si film thickness and the sintering temperature for forming the NiSi crystalline phase from the Ni$_3$Si crystalline phase. Wide margins advantageously result in that the variation in element characteristics to variations in the manufacturing processes is significantly small.

Further, when the thickness of the initial silicon film is too small to apply the method disclosed in the non-patent reference 4, for example, even when the thickness is smaller than or equal to 50 nm, the present invention can provide the same advantageous effects in theory, which is a big advantage.

Moreover, the use of such processes allows separate formation of silicide having a large content of Si as the nMOS gate electrode and silicide having a large content of a metal as the pMOS gate electrode. For example, consider a case where Ni silicide is used. The Ni$_3$Si crystalline phase is formed as the gate electrodes in both the nMOS and pMOS, and then an anti-silicidation reaction film, such as SiO$_2$, is formed only on the pMOS gate electrode. Then, by additionally forming an Si film only on the nMOS gate electrode and sintering the resultant structure, only the nMOS gate electrode can be converted into the NiSi crystalline phase.

(Metal M1)

The metal M1 is not particularly limited to Ni as long as it allows automatic formation of a metal-rich crystalline phase having a uniform composition and a component S1-rich crystalline phase having a uniform composition as described above. To initiate a reaction in which the alloy composition is thus automatically determined, it is essential that there are crystalline phases having at least two different compositions, one having a high content of a metal and the other having a high content of the component S1. Specifically, by supplying an appropriate amount of any of the following elements: Co, Pt, Pd, Re, Ir, Ru, Ti, Ta, V, Cr, Zr, Nb, Mo, and W at an appropriate sintering temperature, it is possible to obtain an alloy whose the composition is automatically determined independent of the other conditions.

(Component S1)

The first and second regions are made of the same component S1. The component S1 may be a single element or include two or more elements. The component S1 can react with the metal M1 to form the first alloy, and react with the first alloy to form the second alloy. The component S1 may contain a trace of impurities. Preferred examples of the component S1 are Si, Si containing a trace of impurities, Si$_z$Ge$_{1-z}$ (0<z<1), and Si$_z$Ge$_{1-z}$ (0<z<1) containing a trace of impurities.

The impurities used herein are atoms to be added to the semiconductor component as the donor or acceptor atom, and Si or Si$_z$Ge$_{1-z}$ can contain such impurities to the extent that the type and amount thereof do not compromise the advantageous effects of the manufacturing method or the characteristics of the MOS of the present invention. When the component S1 contains impurities, the first and second alloys manufactured by using the manufacturing method of the present invention contain the impurities.

For example, the impurities differently affect the effective work function of the gate electrode according to the type of the gate insulating film. When SiO$_2$ or SiON is used for the gate insulating film, the impurities likely change the effective work function of the gate electrode. On the other hand, when a high dielectric constant film, such as HfSiON, is used for the gate insulating film, the impurities relatively less affect the effective work function. Therefore, when impurities is added to the component S1, it is necessary to add desired type and amount of impurities according to the type of the gate insulating film and required characteristics of the MOS. The "high dielectric constant film" (high-K film) used herein refers to a film having a higher dielectric constant than that of the gate insulating film made of SiO$_2$. The value of the dielectric constant of the film is, however, not limited to a specific value.

Specifically, the pre-alloyed first region in the nMOS can contain impurities, such as P, As, and Sb, and the pre-alloyed first region in the pMOS can contain impurities, such as B and In, by an amount of approximately $1 \times 10^{20}$ cm$^{-3}$ in either case. By adding such a concentration and type of impurities, the effective work function can be effectively changed.

The "effective work function" of the gate electrode used herein is typically determined from the flat band obtained in the C-V measurement for the gate insulating film and the gate electrode. The effective work function is derived from the original work function of the gate electrode modified by various factors, such as the fixed charge in the insulating film, the dipole formed at the interface, and the Fermi level pinning. In this sense, the effective work function is distinguished from the original "work function" of the material that forms the gate electrode.

(First Alloy and Second Alloy)

The first alloy can be, for example, any of the following crystalline phases, Ni$_3$Si crystalline phases, Ni$_2$Si crystalline phases, Ni$_3$(Si$_z$Ge$_{1-z}$) (0<z<1) crystalline phases, and Ni$_2$(Si$_z$Ge$_{1-z}$) (0<z<1) crystalline phases (when Ni is used as the metal M1, and Si, Si containing a trace of impurities, Si$_z$Ge$_{1-z}$, Si$_z$Ge$_{1-z}$ containing a trace of impurities, or the like is used as the component S1). The second alloy can be any of the following crystalline phases, NiSi crystalline phases, NiSi$_2$ crystalline phases, Ni(Si$_z$Ge$_{1-z}$) (0<z<1) crystalline phases, or Ni(Si$_z$Ge$_{1-z}$)$_2$ (0<z<1) crystalline phases (when Ni is used as the metal M1, and Si, Si$_z$Ge$_{1-z}$ or the like is used as the component S1).

When the component S1 contains impurities, the resultant first and second alloys may contain the impurities. The impurities, however, do not affect the advantageous effects of the manufacturing method of the present invention because the content of the impurities in the alloys is very low. Therefore, even when the first and second alloys contain impurities, these alloys can herein be considered to be made of crystalline phases.

When the first region is only made of the component S1, the region (1) formed in the first alloying process is entirely be made of the first alloy. Similarly, when the second region is only made of the component S1, the region (2) formed in the second alloying process is entirely be made of the second alloy.

The formation conditions for each of the crystalline phases are listed below with reference to Ni silicide.

First, the number of Ni atoms necessary to form the Ni$_3$Si crystalline phase as the first alloy is three times or more the number of Si atoms present in the first region. To supply Ni three times the amount of Si, the thickness of the Ni film is preferably set to a value approximately greater than 1.7 times the thickness of the Si film (in FIG. 4(a), for example, the thickness W$_1$ in the direction 46 is preferably greater than 1.7 times the thickness W$_2$). When the stacked structure of the first region and the Ni film thereon having a thickness greater than 1.7 times the thickness of the first region undergoes heat treatment at a temperature ranging from 350 to 650° C. in a non-oxidative atmosphere, a reaction between Ni and Si proceeds and Ni silicide (Ni$_3$Si crystalline phase) is reliably formed.

In general, the most stable crystalline phase under the heat treatment condition of 350 to 600° C. is the NiSi crystalline phase, whereas the most stable crystalline phase is the NiSi$_2$ crystalline phase at 600° C. or higher. However, when the number of Ni atoms that can react with Si atoms is greater than three times the number of Si atoms, the $Ni_3Si$ crystalline phase is formed as the stable phase. Since the silicidation reaction automatically stops when all the Si has reacted into the $Ni_3Si$ crystalline phase, the excess Ni other than three times the initial amount is left unreacted above the $Ni_3Si$ crystalline phase. The Ni that has not reacted is selectively removed by using sulfuric acid/hydrogen peroxide.

In this way, a fixed $Ni_3Si$ crystalline phase is always provided under a significantly broad condition that the thickness of the Ni film is greater than 1.7 times the thickness of the Si film (no upper limit) and heat treatment is carried out at a temperature ranging from 350 to 650° C.

On the other hand, the number of Ni atoms necessary to form the $Ni_2Si$ crystalline phase as the first alloy is at least twice the number of Si atoms present in the first region. To supply Ni twice the amount of Si, the thickness of the Ni film is preferably set to a value approximately greater than 1.1 times the thickness of the Si film (in FIG. 4(a), for example, the thickness $W_1$ in the direction 46 is preferably greater than 1.1 times the thickness $W_2$). When the stacked structure of the first region and the Ni film thereon having a thickness greater than 1.1 times the thickness of the first region undergoes heat treatment at a temperature ranging from 240 to 300° C. in a non-oxidative atmosphere, a reaction between Ni and Si proceeds and Ni silicide ($Ni_2Si$ crystalline phase) is formed.

Since the most stable crystalline phase under the heat treatment condition of a relatively low temperature ranging from 240 to 300° C. is the $Ni_2Si$ crystalline phase, the $Ni_2Si$ crystalline phase is formed as the stable crystalline phase. Since the silicidation reaction automatically stops when all the Si has reacted into the $Ni_2Si$ crystalline phase, the excess Ni other than twice the initial amount is left unreacted above the $Ni_2Si$ crystalline phase, as in the $Ni_3Si$ crystalline phase. The Ni that has not reacted is selectively removed by using sulfuric acid/hydrogen peroxide.

That is, a fixed $Ni_2Si$ crystalline phase is always provided under a condition that the thickness of the Ni film is greater than 1.1 times the thickness of the Si film (no upper limit) and heat treatment is carried out at a temperature ranging from 240 to 300° C.

Then, Si is further deposited on the $Ni_3Si$ crystalline phase and heat treatment is carried out to the resultant structure so as to convert entire structure into the NiSi crystalline phase as the second alloy. The number of Si atoms in the combined structure of the already formed $Ni_3Si$ crystalline phase and the additionally deposited Si needs to be the same as the number of Ni atoms therein. To this end, the amount of Si necessary to be deposited is at least greater than twice the amount of Si contained in the $Ni_3Si$ crystalline phase (in other words, twice the amount of Si initially present as SI). To provide such an amount in terms of film thickness, the thickness of the Si film is preferably greater than twice the thickness of the first region (in FIG. 4(b), for example, the thickness $W_3$ in the direction 46 is preferably greater than twice the thickness $W_2$).

Heat treatment is carried out to the stacked structure of the $Ni_3Si$ crystalline phase, which is the first alloy, and the Si film thereon having a thickness greater than twice the thickness of the first region, at a temperature ranging from 350 to 550° C. in a non-oxidative atmosphere. The heat treatment diffuses Ni in the $Ni_3Si$ crystalline phase into the additionally deposited Si, so that the $Ni_3Si$ crystalline phase and the additionally deposited Si are reliably converted into the NiSi crystalline phase, which is the most stable crystalline phase in this temperature range. Since the supply of Ni stops when the entire $Ni_3Si$ crystalline phase has been converted into the NiSi crystalline phase, the reaction in which the additional Si is converted into NiSi also automatically stops, and the excess Si other than twice the initial amount is left unreacted above the NiSi crystalline phase. The Si that has not reacted is selectively removed by using a tetramethyl ammonium hydroxide solution.

That is, a fixed NiSi crystalline phase is always provided from the $Ni_3Si$ crystalline phase under a significantly broad condition that the thickness of the Si film is greater than twice the film thickness of the first region (no upper limit) and heat treatment is carried out at a temperature ranging from 350 to 550° C.

On the other hand, when Si is deposited on the $Ni_2Si$ crystalline phase and heat treatment is carried out to the resultant structure so as to convert the entire structure into the NiSi crystalline phase, the amount of Si necessary to be deposited is at least more than the amount of Si contained in the $Ni_2Si$ crystalline phase (in other words, more than the amount of Si initially present as S1). Except this point, the same principle as that used in the $Ni_3Si$ crystalline phase can be used to form the NiSi crystalline phase. To form the second region containing Si more than the amount contained in the $Ni_2Si$ crystalline phase, the film thickness of the second region to be deposited is preferably greater than the thickness of the first region (in FIG. 4(b), for example, the thickness $W_3$ in the direction 46 is preferably greater than the thickness $W_2$).

In the case where Si is further deposited on the $Ni_3Si$ crystalline phase and heat treatment is carried out to the resultant structure so as to convert the entire structure into the $NiSi_2$ crystalline phase as the second alloy, the number of Si atoms in the combined structure of the already formed $Ni_3Si$ crystalline phase and the additionally deposited Si needs to be twice the number of Ni atoms therein. To this end, the amount of Si necessary to be deposited is at least greater than five times the amount of Si contained in the $Ni_3Si$ crystalline phase (in other words, five times the amount of Si initially present in the first region). In terms of film thickness, the thickness of the Si film is preferably greater than five times the thickness of the first region (in FIG. 4(c), for example, the thickness $W_3$ in the direction 46 is preferably greater than five times the thickness $W_2$). To achieve such a film thickness, the thickness of the Si film on the entire exposed portion of the $Ni_3Si$ crystalline phase (region (1)) is set to a value greater than five times the thickness of the first region.

Heat treatment is carried out to the stacked structure of the $Ni_3Si$ crystalline phase, which is the first alloy, and the Si film thereon having a thickness greater than five times the thickness of the first region, at a temperature ranging from 650 to 800° C. in a non-oxidative atmosphere. The heat treatment diffuses Ni in the $Ni_3Si$ crystalline phase into the additionally deposited Si, so that the $Ni_3Si$ crystalline phase and the additionally deposited Si are converted into the $NiSi_2$ crystalline phase, which is the most stable crystalline phase in this temperature range. Since the supply of Ni stops when the entire $Ni_3Si$ crystalline phase has been converted into the $NiSi_2$ crystalline phase, the reaction in which the additional Si is converted into $NiSi_2$ also automatically stops, and the excess Si other than five times the initial amount is left unreacted above the $NiSi_2$ crystalline phase. The Si that has not reacted is selectively removed by using a tetramethyl ammonium hydroxide solution. That is, a fixed $NiSi_2$ crystalline phase is always provided from the $Ni_3Si$ crystalline phase under a significantly broad condition that the thickness of the Si film is greater than five times the film thickness of the first region (no upper limit) and heat treatment is carried out at a temperature ranging from 650 to 800° C.

On the other hand, when Si is deposited on the $Ni_2Si$ crystalline phase and heat treatment is carried out to the resultant structure so as to convert the entire structure into the $NiSi_2$ crystalline phase, the amount of Si necessary to be deposited is at least greater than three times the amount of Si contained in the $Ni_2Si$ crystalline phase (in other words, three times the amount of Si initially present in the first region). Except this point, the same principle as that used in the $Ni_3Si$ crystalline phase can be used to form the $NiSi_2$ crystalline phase from the $Ni_2Si$ crystalline phase. To form the second region containing Si more than the amount of Si contained in the $Ni_2Si$ crystalline phase, the film thickness of the second region to be deposited is preferably greater than twice the thickness of the first region (in FIG. 4(c), for example, the thickness $W_3$ in the direction 46 is preferably greater than twice the thickness $W_2$). To achieve such a film thickness, the thickness of the Si film on the entire exposed portion of the $Ni_2Si$ crystalline phase (region (1)) is set to a value greater than twice the thickness of the first region.

The first and second alloys formed in the manufacturing method of the present invention are made of the same elements but differ in terms of composition. The first alloy is made of the crystalline phase expressed by $M1_{x1}S1_{y1}$ (x1 and y1 are natural numbers). On the other hand, the second alloy is made of the crystalline phase expressed by $M1_{x2}S1_{y2}$ (x2 and y2 are natural numbers). Since the first alloy is further coupled with the component S1 to form the second alloy, the ratio of the component S1 to the metal M1 in the crystal composition of the second alloy is greater than that of the first alloy (y2/x2>y1/x1).

In the crystalline phases $M1_{1x}S1_{y1}$ and $M1_{x2}S1_{y2}$, x1, y1, x2, and y2 are natural numbers. The values of x1, y1, x2, and y2 herein may slightly shift from natural numbers because, for example, the first and second alloys contain a trace of impurities and the like, and the actual crystals are not perfect. Even in such a case, these values are handled as natural numbers in the present invention. Specifically, in the crystalline phases expressed by $M1_{1x}S1_{y1}$ and $M1_{x2}S1_{y2}$, even when the x1, y1, x2, and y2 shift from predetermined natural numbers by ±0.05, x1, y1, x2, and y2 are regarded as natural numbers. The ranges of x1, y1, x2, and y2 are expressed as follows:

$a-0.05 \leq x1 \leq a+0.05$ $b-0.05 \leq y1 \leq b+0.05$ $c-0.05 < x2 < c+0.05$ $d-0.05 < y2 < d+0.05$ (In the above equations, a, b, c, and d are natural numbers.)

It is noted that M1 and/or S1 may include multiple elements. When M1 and/or S1 include multiple elements, the number of all metal M1 atoms and the number of all component S1 atoms satisfy the following relationship: x1:y1 (first alloy) or x2:y2 (second alloy).

(Process for Exposing First Region)

In the manufacturing method of the present invention, after the gate insulating film, the first region, and a mask are formed on a semiconductor layer, impurities are implanted into the semiconductor layer to form extension regions 6. Then, after gate sidewalls are formed on the sides of the gate insulating film, the first region, and the mask, the gate sidewalls and the mask are used as a mask to implant impurities into the semiconductor layer so as to form source/drain regions 8. Further, the mask is removed to expose the upper surface of the first region.

In this process, although the gate sidewalls may be removed by the same amount as the depth of the mask, it is preferable to only remove the mask but leave the gate sidewalls intact. By thus leaving the gate sidewalls and adjusting the thickness of the first region, the content of the component S1, and the thickness of the mask, the manufactured gate electrode can be entirely sandwiched between the gate sidewalls, so that the gate length becomes fixed.

That is, the thicknesses of the first region and the mask can be selected in the formation process, the composition of the first alloy can be selected in the first deposition process and the first alloying process, and the composition of the second alloy can be selected in the second deposition process and the second alloying process, such that the top surface of the gate electrode can be lower than the top portions of the gate sidewalls.

The reason of this will be described below in detail. That is, in the manufacturing method of the present invention, the first and second alloying processes are designed to form first and second alloys (made of crystalline phases) having stoichiometric composition ratios. Therefore, once the target stoichiometric composition ratios (composition ratios of the crystalline phases) of the first and second alloys, the thickness of the first region, and the content of the component S1 are determined, the amount of metal M1 that reacts with the component S1 and the thickness of the first alloy layer expanded in the alloying process as well as the amount of component S1 that reacts with the first alloy and the thickness of the second alloy layer expanded in the alloying process are uniquely determined. On the other hand, the height of the top portions of the gate sidewalls is equal to the sum of the thickness of the first region and the thickness of the mask provided in advance.

In the case that the gate sidewalls are left in the process for exposing the first region, the depth of the recess to be formed after the mask has been removed (corresponding to the thickness of the mask) can be controlled by adjusting the thickness of the mask. Therefore, by controlling the thickness of the first region, the content of the component S1, the thickness of the mask, and the composition ratios of the crystalline phases of the first and second alloys (by controlling the conditions in such a way that the thickness of the second alloy layer, which is uniquely determined by the thickness of the first region, the content of the component S1, and the composition ratios of the first and second alloys, is smaller than the sum of the thickness of the first region and the thickness of the mask), the top portions of the gate sidewalls can be higher than the top surface of the formed second alloy.

As a result, there is provided a MOS transistor in which the sides of the manufactured gate electrode are entirely sandwiched between the gate sidewalls. It is noted that the same advantageous effect can be provided by forming the first region and the mask and forming the first and second alloys in such a way that the top surface of the gate electrode is as high as the top portions of the gate sidewalls.

(Process for Forming Metal M1-Containing Layer, First and Second Alloying Processes, and Process for Depositing First and Second, Regions)

Each of the above processes in the manufacturing method of the present invention needs to be carried out in such a way that the following conditions are satisfied:

Process for Forming Metal M1-Containing Metal Layer;

The metal M1-containing layer is formed at a temperature at which the resistance of silicide films provided on the source/drain regions does not get higher.

The metal M1-containing layer is formed in such a way that it contains an amount of metal M1 more than metal M1 necessary to form the first alloy made of the crystalline phase expressed by $M1_{x1}Si_{y1}$ (x1 and y1 are natural numbers) through a reaction between all the component S1 in the first region and the metal M1 (A layer containing metal M1 more than (the amount of component S1 in the first region)×(x1/y1) is formed).

When the manufacturing method of the present invention is used to manufacture a semiconductor device only with an nMOS or a pMOS, a layer containing an amount of metal M1 more than metal M1 necessary to convert one first region deposited on the n-type or p-type semiconductor region into the first alloy made of the crystalline phase expressed by $M1_{x1}Si_{y1}$ (x1 and y1 are natural numbers) is formed.

When the manufacturing method of the present invention is used to manufacture a semiconductor device with an nMOS and a pMOS, a layer containing an amount of metal M1 more than metal M1 necessary to convert two first regions deposited on the n-type and p-type semiconductor regions into the first alloy made of the crystalline phase expressed by $M1_{x1}Si_{y1}$ (x1 and y1 are natural numbers) is formed.

First Alloying Process;

The reaction is carried out in a non-oxidative atmosphere.

The reaction is carried out between substantially all the S1 in the first region and the metal M1 (the entire first region is converted into the region (1) made of the first alloy).

The first alloy made of the crystalline phase expressed by $M1_{x1}Si_{y1}$ (x1 and y1 are natural numbers) is formed.

Among two or more crystalline phases having different compositions containing the metal M1 and the component S1, the crystalline phase $M1_{x1}Si_{y1}$ is not the one having a composition with the lowest metal content.

The reaction is carried out at a temperature at which the resistance of silicide films provided on the source/drain regions does not get higher.

Process for Forming Metal Layer (First Deposition Process);

The metal layer may be deposited at least on the first region deposited in the formation process. In this process, the metal layer may be deposited on part of the region and occupy a fixed area, or may have a layer-like shape deposited on the entire region.

Process for Forming Second Region (Second Deposition Process);

The second region is formed at a temperature at which the resistance of silicide films provided on the source/drain regions does not get higher.

The second region is formed in such a way that it contains an amount of component S1 more than component S1 necessary to form the second alloy made of the crystalline phase expressed by $M1_{x2}Si_{y2}$ (x2 and y2 are natural numbers, y2/x2>y1/x1) through a reaction between all the first alloy and the component S1 (The second region is formed in such a way that it contains an amount of component S1 more than (the amount of metal M1 in the first alloy)×(y2/x2−x1/y1)).

Among two or more crystalline phases having different compositions containing the metal M1 and the component S1, the crystalline phase $M1_{x2}Si_{y2}$ is not the one having a composition with the highest metal content.

The second region may be deposited in such a way that it is in contact with at least part of the region (1) made of the first alloy formed in the first alloying process. In this process, the second region may be deposited on part of the region (1) and occupy a fixed area, or may have a layer-like shape deposited on the entire region (1).

Second Alloying Process;

The reaction is carried out in a non-oxidative atmosphere.

The reaction is carried out between substantially all the first alloy and the component S1 in the second region (the entire region made of the first alloy is converted into the region (2) made of the second alloy).

The content of the component S1 in the second alloy is greater than the content of the component S1 in the first alloy (y2/x2>y1/x1).

The reaction is carried out at a temperature at which the resistance of silicide films provided on the source/drain regions does not get higher.

(Process for Removing Layers and Regions)

Process for Removing Metal Layer Containing Metal M1;

Wet etching can be carried out by using various solutions according to the type of the metal layer containing the metal M1. For example, when Ni is used as the metal M1, a solution of $H_2SO_4:H_2O_2=3:1$ (by mass) is used to carry out wet etching for ten minutes.

Process for Removing Second Region;

Wet etching is carried out by using various solutions according to the type of the component S1 that forms the second region. For example, when Si is used as the component S1, a 22 mass % tetramethyl ammonium hydroxide solution is used to carry out wet etching by heating at 40° C. for ten minutes.

The process for forming the metal layer containing the metal M1 may occur concurrently with the first alloying process, in which the first alloy is formed during the formation of the metal layer containing the metal M1. Similarly, the process for forming the second region may occur concurrently with the second alloying process, in which the second alloy is formed during the formation of the second region. Even when the first and second alloying processes thus occur concurrently with other processes, there are formed alloys having predetermined compositions automatically determined according to the reaction conditions.

Each exemplary embodiment of the present invention will be described below with reference to the drawings.

First Exemplary Embodiment

FIGS. 3(a) to 3(g) and FIGS. 4(a) to 4(e) are cross-sectional views showing an exemplary embodiment of the processes for fabricating a single MOS of the present invention. In this exemplary embodiment, Ni silicide was formed as the gate electrode. Specifically, the $Ni_3Si$ crystalline phase was formed as the silicide having a high content of a metal (first alloy), and the NiSi crystalline phase was formed as the silicide having a high content of Si (second alloy).

Figure 3:
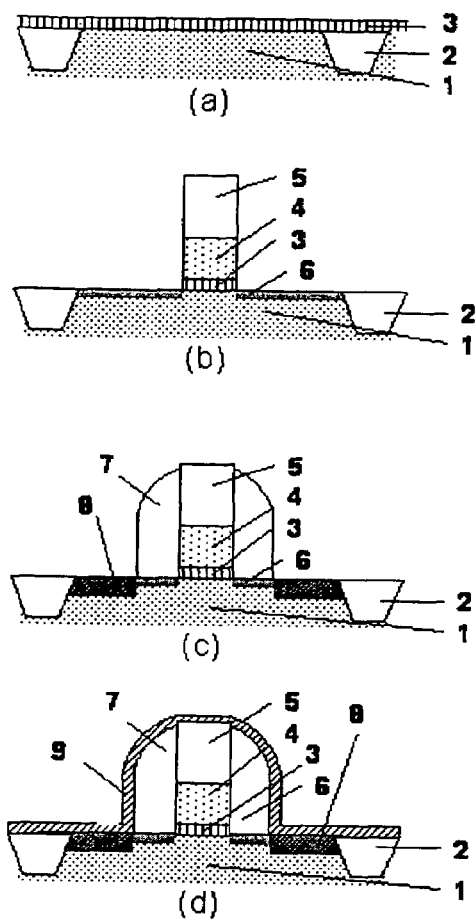
FIG. 3 shows processes for manufacturing a semiconductor device according to a first exemplary embodiment of the present invention.
Figure 3:
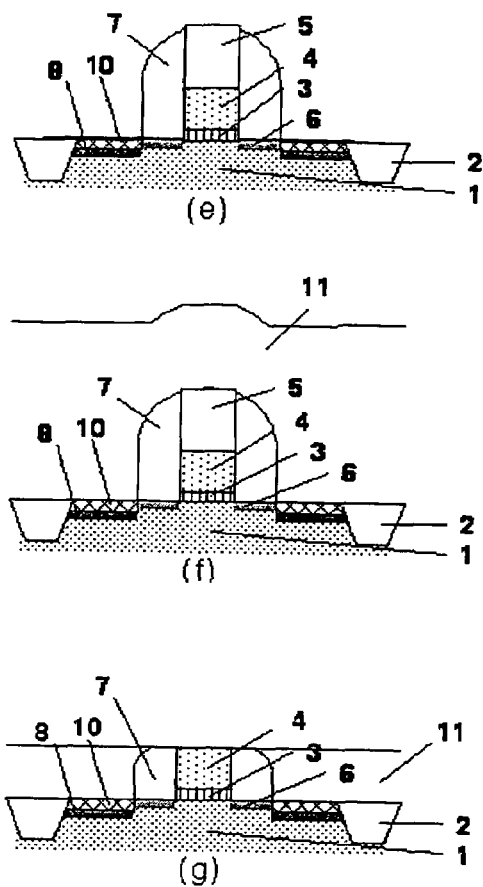

First, as shown in FIG. 3(a), STI (Shallow Trench Isolation) technology was used to form isolation regions 2 in the surface area of a silicon substrate 1. A gate insulating film 3 was subsequently formed on the surface of the isolated silicon substrate. The gate insulating film can be any of a silicon oxide film, a silicon nitride film, and a high dielectric constant insulating film made of a metal oxide, a metal silicate, or a metal oxide or metal silicate into which nitrogen is introduced.

In this exemplary embodiment, an HfSiON film containing Hf as the metal element in the gate insulating film was used. In the HfSiON film, HfSiON is substantially distributed also in the part of the gate insulating film that is in contact with the gate electrode. The reason why an HfSiON film is used as the gate insulating film is, as described in the non-patent reference 3, that when combined with the gate electrode made of Ni silicide used in this exemplary embodiment, the effective work function changes according to the composition of the Ni silicide and the composition of the Ni silicide can be easily identified.

Such change in effective work function is provided by the interaction between Hf in the HfSiON and Si in the Ni silicide (Fermi level pinning). Thus, even when the metal element that forms the silicide is not Ni, change in effective work function according to the composition of the silicide is observed. In this process, a silicon oxide film or a silicon nitride film may be introduced at the interface between the silicon substrate and the HfSiON film. In this exemplary embodiment, a 1.9 nm-thick silicon thermal oxide film was formed, and then a 1.5 nm-thick HfSiO film was deposited by using MOCVD. Then, the HfSiON film was obtained by carrying out nitridation anneal at 900° C. for ten minutes in an $NH_3$ atmosphere.

Then, a stacked film formed of a 60 nm-thick poly-Si film (polysilicon film: first region: the component S1 was silicon) 4 and a 100 nm-thick dummy oxide film 5 (mask) was formed on the gate insulating film 3 (formation process). The stacked film was processed by using lithography technology and RIE (Reactive Ion Etching) technology to form the gate insulating film 3, the poly-Si film 4, and the dummy oxide film 5 jutting out from the silicon substrate 1 as shown in FIG. 3(b). Subsequently, ion implantation was carried out to form extension diffusion layer regions 6 in a self-alignment manner by using the dummy oxide film 5 as a mask.

Further, as shown in FIG. 3(c), a silicon oxide film was deposited and then etched back to form gate sidewalls 7 on both sides of the gate insulating film 3, poly-Si film 4, and dummy oxide film 5. In this state, ion implantation was carried out again, followed by activation anneal, so that source/drain diffusion regions 8 were formed in the silicon substrate 1 on both sides of the poly-Si film 4.

Then, as shown in FIG. 3(d), a 20 nm-thick metal film 9 was deposited on the entire surface by using sputtering, and the first region, the gate sidewalls, and the STI were used as a mask to form silicide layers 10 approximately 20 nm thick only on the source/drain diffusion regions 8 by using salicide technology. Then, the excess metal film was selectively removed by wet etching (FIG. 3(e)). The silicide layer 10 was Ni monosilicide (NiSi), which can minimize the contact resistance. The Ni silicide may be replaced with Co silicide or Ti silicide.

Further, as shown in FIG. 3(f), an interlayer insulating film 11 formed of a 500 nm-thick silicon oxide film was formed by using CVD (Chemical Vapor Deposition). The interlayer insulating film 11, which was the silicon oxide film, was planarized by using CMP technology, and the remaining interlayer insulating film 11, the gate sidewalls 7, and the dummy oxide film 5 were simultaneously etched back to expose the poly-Si (polysilicon; first region) 4 for the gate electrode as shown in FIG. 3(g) (exposing process).

Figure 4:
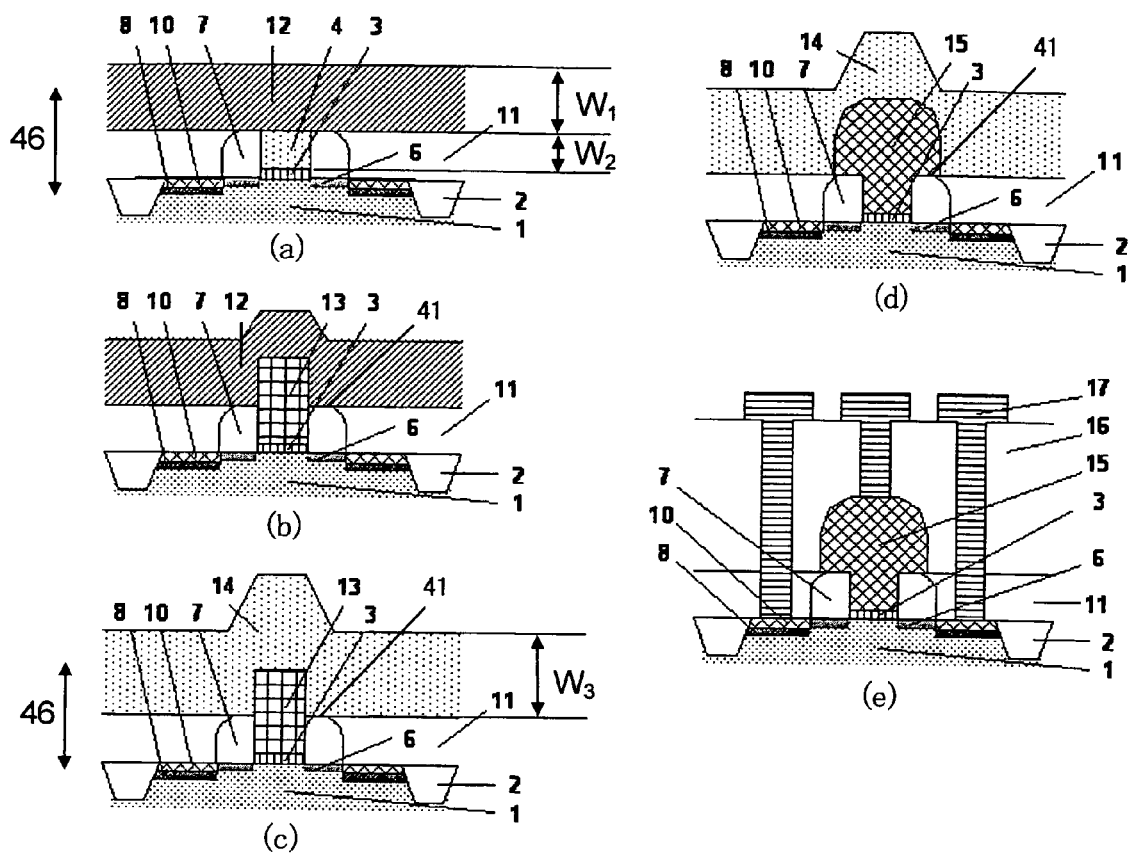
FIG. 4 shows processes for manufacturing a semiconductor device according to the first exemplary embodiment of the present invention.

Then, as shown in FIG. 4(a), Ni (metal M1) was deposited as a metal film 12 for forming silicide in conjunction with the poly-Si 4 for the gate electrode (first deposition process). In this process, the metal film can be made of any metal capable of forming silicide in conjunction with the poly-Si 4. For example, at least one metal can be selected from the group consisting of Co, Pt, Pd, Re, Ir, Ru, Ti, Ta, V, Cr, Zr, Nb, MO, and W. It is preferable to use a metal that can fully convert the poly-Si 4 into silicide at a temperature at which the resistance of the silicide layers 10 already formed on the source/drain diffusion regions 8 does not get any higher.

For example, when Ni monosilicide (NiSi) layers have been formed on the source/drain diffusion regions 8, it is necessary to prevent increase in contact resistance between the source/drain diffusion region 8 and the contact plug when the Ni monosilicide is converted into Ni disilicide ($NiSi_2$). To this end, the process temperature in the following process needs to be lower than or equal to 450° C., and it is therefore necessary to use a metal that is converted into silicide at 450° C. or below in a satisfactory manner.

In this embodiment, the thickness of the Ni film in this process is set in such a way that poly-Si reacts with Ni in a satisfactory manner so that the entire poly-Si is converted into $Ni_3Si$ (a film thickness containing Ni atoms greater than Ni atoms necessary to convert at least all the Si into $Ni_3Si$). In this embodiment, DC magnetron sputtering was used to form the Ni film to a thickness of 110 nm at room temperature ($W_1$ in FIG. 4(a) represents the thickness of the Ni film, and $W_2$ represents the thickness of the poly-Si film).

Then, heat treatment corresponding to the first alloying process was carried out to initiate a reaction between the poly-Si 4 on the gate insulating film and the Ni 12. The heat treatment needs to be carried out in a non-oxidative atmosphere to prevent oxidation of the metal film. At the same time, the heat treatment needs to be carried out at a temperature at which the diffusion speed is fast enough to convert all the poly-Si 4 on the gate insulating film into silicide and the resistance of the silicide layers 10 formed on the source/drain diffusion regions 8 does not get higher. In this embodiment, since both the silicide formed on the source/drain diffusion regions 8 and the silicide to be formed as the gate electrode are Ni silicide, the heat treatment was carried out at 400° C. for two minutes in a nitrogen gas atmosphere. The acceptable alloying temperature can be higher, for example, temperatures on the order of 800° C., when the silicide formed on the source/drain diffusion regions 8 is Co silicide or Ti silicide. However, since the stable silicide phase at 650° C. or higher is the $NiSi_2$ crystalline phase, the actual temperature is desirably 600° C. or lower.

In the heat treatment, as shown in FIG. 4(b), the 110 nm-thick Ni film reacted with the 60 nm-thick poly-Si, so that an $Ni_3Si$ crystalline phase region (1) 13 (y1/x1=1/3) was formed until it reached immediately above the gate insulating film 3 (first alloying process). Since this reaction automatically stops when all the poly-Si 4 has reacted into the $Ni_3Si$ crystalline phase, a longer reaction period can be set to reduce element-to-element variation. As a result, there is provided a MOS with uniform surface texture of the gate electrode and uniform element characteristics. To achieve such advantages, the heat treatment in this embodiment was carried out for two minutes, although several tens of seconds is typically enough for the full-silicidation reaction between the 110 nm-thick Ni film and the 60 nm-thick poly-Si at 400° C.

It was confirmed by using Rutherford backscattering spectrometry (RBS) that the thus formed $Ni_3Si$ crystalline phase had a fixed composition of Ni/(Ni+Si)=0.75 in the film thickness direction, which was the stoichiometric composition ratio. In this process, in course of the formation of the $Ni_3Si$ crystalline phase region (1) 13 from the poly-Si 4 and Ni, volume expansion occurs in such a way that the thickness of the resultant region (1) 13 becomes approximately 2.1 times the thickness of the poly-Si 4. This is a reaction process in which the silicidation proceeds through diffusion of Ni into poly-Si. Therefore, the width of the produced $Ni_3Si$ crystalline phase region (1) always coincides with the gate length (the channel length-direction width of the portion of the first region, the region (1) made of the first alloy, or the region (2) made of the second alloy that is in contact with the gate insulating film), and the Ni$_3$Si crystalline phase whose width coincides with the gate length is pushed upward as the reaction proceeds. That is, no Ni$_3$Si crystalline phase (region (1)) whose width is greater than the gate length is produced.

Then, the excess Ni film that has not undergone the silicidation reaction in the heat treatment was removed by wet etching using sulfuric acid/hydrogen peroxide. The wet etching will not affect the Ni$_3$Si crystalline phase region (1), so that the surface texture of the gate electrode, the element characteristics of the MOS and the like are kept uniform. Further, an additional silicon layer (second region: the component S1 was silicon) 14 was stacked (second deposition process), as shown in FIG. 4(c). The additional silicon layer 14 is intended to initiate a reaction with the Ni$_3$Si crystalline phase region (1) 13 so as to convert the entire Ni$_3$Si crystalline phase region (1) 13 into NiSi. To this end, silicon atoms twice the number of those in the initial poly-Si 4 (which reacted with Ni when the Ni$_3$Si crystalline phase was formed from Ni and Si) need to react with the Ni$_3$Si crystalline phase. The additional silicon layer 14 to be formed therefore needs to contain Si atoms necessary to convert at least all the Ni$_3$Si crystalline phase into NiSi. The thickness of the additional silicon layer 14 is desirably set to a value twice or more the thickness of the initial poly-Si 4. In practice, however, as shown in the figure, since the additional silicon layer 14 deposited on the sides of the Ni$_3$Si crystalline phase region (1) 13 also contributes to the reaction, the film thickness is not necessarily twice or more. In this embodiment, the thickness of the deposited additional silicon layer 14 was 150 nm, which was 2.5 times the thickness of the initial poly-Si 4 ($W_3$ in FIG. 4(c) represents the film thickness of the additional silicon layer 14).

Since the additional silicon layer 14 needs to be deposited at a temperature at which the resistance of the silicide layers 10 formed on the source/drain diffusion regions 8 do not get higher, the deposition temperature needs to be 500° C. or lower in this embodiment. In this embodiment, the silicon was deposited at room temperature by using sputtering. When the silicide formed on the source/drain diffusion regions 8 is Co silicide or Ti silicide, additional silicon can be deposited at a higher temperature, which allows use of poly-Si or amorphous Si, which can be formed at a temperature on the order of 500 to 650° C. by using CVD. In this case, the NiSi-silicidation reaction proceeds concurrently with the deposition.

Then, as shown in FIG. 4(d), heat treatment corresponding to the second alloying process was carried out to initiate a reaction between the additional silicon layer 14 and the Ni$_3$Si crystalline phase so as to convert them into NiSi crystalline phase (y2/x2=1). The heat treatment needs to be carried out at a temperature at which the diffusion speed is fast enough to convert all the Ni$_3$Si crystalline phase 13 into NiSi and the resistance of the silicide layers 10 formed on the source/drain diffusion regions 8 does not get higher. The acceptable temperature may be higher, for example, temperatures on the order of 800° C., when the silicide formed on the source/drain diffusion regions 8 is Co silicide or Ti silicide. However, since the stable silicide phase at 650° C. or higher is the NiSi$_2$ crystalline phase, the temperature is desirably 600° C. or lower in practice.

In this embodiment, since both the silicide formed on the source/drain diffusion regions 8 and the silicide to be formed as the gate electrode are Ni silicide, the heat treatment was carried out at 400° C. for five minutes in a nitrogen gas atmosphere. Since this reaction automatically stops when all the Ni$_3$Si crystalline phase has reacted into the NiSi crystalline phase, a longer reaction period can be set to reduce element-to-element variation. As a result, there is provided a MOS with uniform surface texture of the gate electrode and uniform element characteristics. Further, the two-step alloying process in the manufacturing method of the present invention can make the surface texture of the gate electrode and the element characteristics of the MOS uniform in a more effective manner.

This reaction proceeds in such a way that Ni in the Ni$_3$Si crystalline phase diffuses into the additional silicon 14. In the portion lower than the top portions 41 of the gate sidewalls 7, the gate sidewalls are present. Therefore, the width of the NiSi crystalline phase (region (2)) becomes the same width as the gate length. On the other hand, in the portion higher than the top portions 41 of the gate sidewalls 7, no gate sidewall allows the NiSi crystalline phase to grow in an isotropic manner into a gate electrode 15 made of NiSi crystalline phase. The width of the upper portion of the resultant NiSi crystalline phase gate electrode 15 is therefore greater than the gate length.

Further, the additional silicon layer 14 that has been left unreacted was removed by wet etching using a 22 mass % tetramethyl ammonium hydroxide solution. The wet etching will not affect the NiSi crystalline phase gate electrode 15, so that the surface texture thereof and the like are kept uniform. Then, an interlayer insulating film 16 was formed and planarized through CMP, and then a contact plug 17 was formed via the interlayer insulating film 16. The MOS including the structure shown in FIG. 4(e) was thus finally provided. Throughout the above processes, no separation of the silicide electrode was observed.

Figure 5:
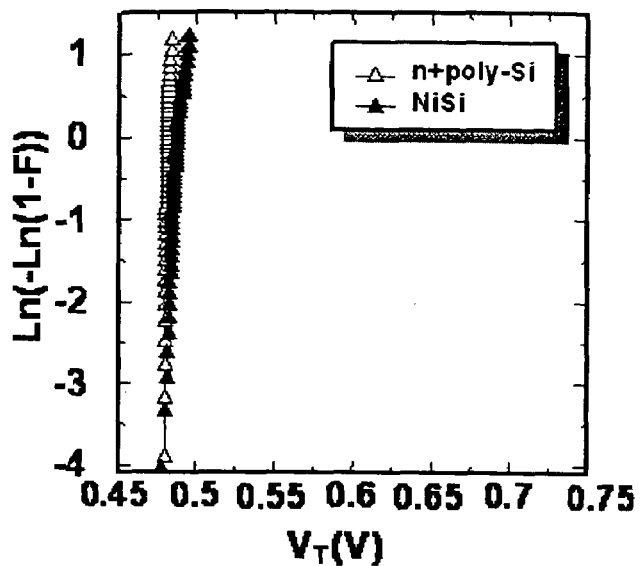
FIG. 5 shows the measurement result of variation (Weibull plot) in threshold voltage ($V_{th}$) of a semiconductor device fabricated according to an exemplary embodiment of the invention.

FIG. 5 and the data fields in the "First exemplary embodiment" row in Table 1 show variation in threshold voltage ($V_{th}$) of the nMOS with the NiSi crystalline phase gate electrode obtained by using this exemplary embodiment and an nMOS with an n+poly-Si gate electrode, each of the gate electrodes having a gate length of 0.05 µm. For example, the slope of the Weibull plot for the NiSi crystalline phase gate electrode in FIG. 5 is significantly large, which indicates that the NiSi crystalline phase gate electrode obtained by using this exemplary embodiment, although having a short gate length, has uniformity comparable to that of the n+poly-Si gate electrode. Further, from the value of $V_{th}$, the effective work function is expected to be 4.5 eV, which substantially coincides with the effective work function of the NiSi electrode on HfSiON. It can thus be said that in the NiSi gate electrode obtained by using this exemplary embodiment, although it is a very narrow gate electrode, a uniform NiSi crystalline phase has been formed. Further, the gate leak current in the nMOS of this exemplary embodiment can be effectively reduced as compared to that in the MOS with the n+poly-Si gate electrode.

Second Exemplary Embodiment

FIGS. 6(a) to 6(g) and FIGS. 7(a) to 7(e) are cross-sectional views showing another exemplary embodiment of a MOS of the present invention. In this exemplary embodiment, Ni silicide was used as the gate electrode. Specifically, the Ni$_3$Si crystalline phase was formed as the silicide having a high content of a metal (first alloy), and the NiSi crystalline phase was formed as the silicide having a high content of Si (second alloy).

Figure 6:
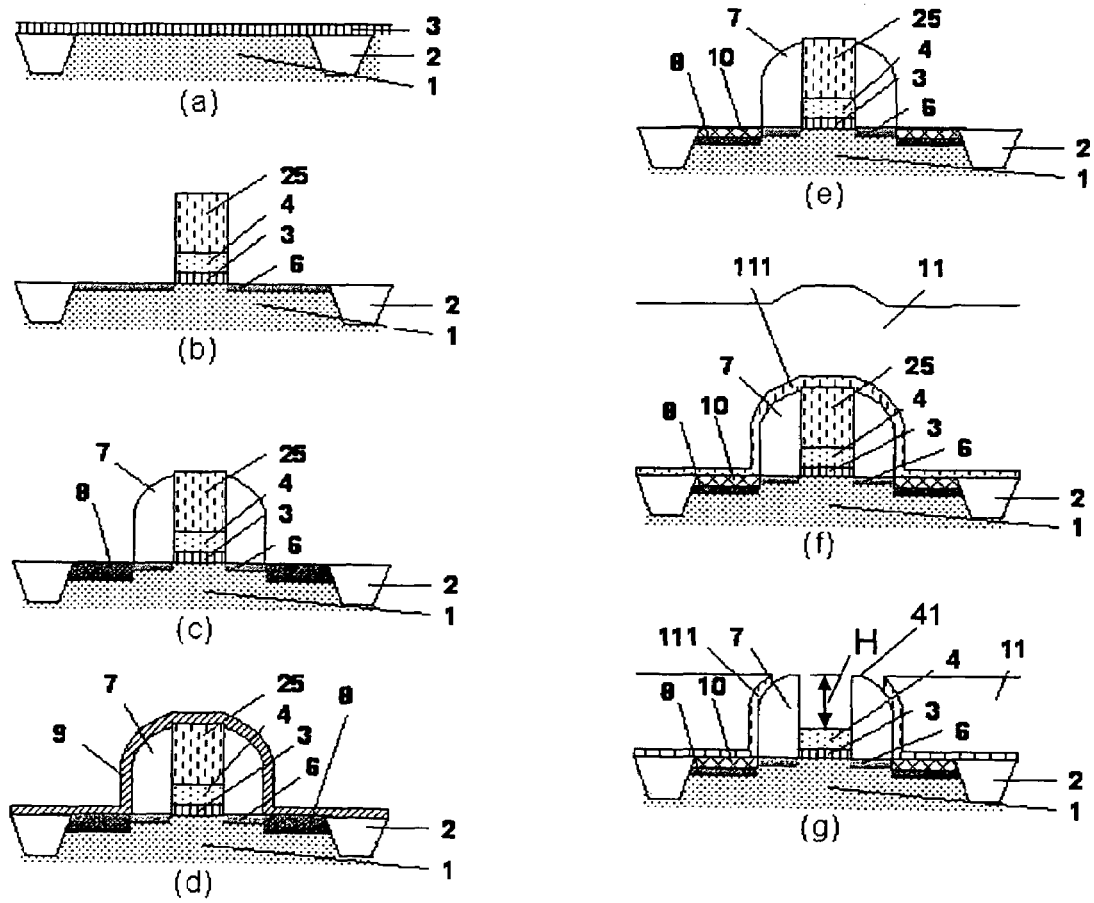
FIG. 6 shows processes for manufacturing a semiconductor device according to a second exemplary embodiment of the present invention.

As shown in FIG. 6(a), STI technology was used to form isolation regions 2 in the surface area of a silicon substrate 1. A gate insulating film 3 was subsequently formed on the surface of the isolated silicon substrate. This process is the same as that in FIG. 3(a).

Then, a stacked film formed of a 30 nm-thick poly-Si film (first region: the component S1 was silicon) 4 and a 90 nm-thick silicon nitride film (mask) 25 was formed on the gate insulating film 3 (formation process). The stacked film was processed by using lithography technology and RIE (Reactive Ion Etching) technology to form the gate insulating film 3, the poly-Si film 4, and the silicon nitride film 25 jutting out from the silicon substrate 1 as shown in FIG. 6(b). Subsequently, ion implantation was carried out by using the poly-Si film 4 and the silicon nitride film 25 as a mask to form extension diffusion layer regions 6 in a self-aligning manner.

As shown in FIGS. 6(c) to 6(f), the following processes: the formation of gate sidewalls 7, the formation of source/drain diffusion regions 8, the formation of silicide layers 10 on the source/drain diffusion regions 8, and the formation of an interlayer insulating film 11 are the same as those shown in FIGS. 3(c) to 3(f). In this exemplary embodiment, a silicon nitride film layer 111 having a thickness on the order of 20 nm may be inserted before the formation of the interlayer insulating film 11, which is an oxide film, because the silicon nitride film 111, which will be exposed in the later process for etching back the silicon nitride film 25, will be eventually etched away so that the silicon nitride layer 111 will not be left on the gate electrode of the manufactured MOS. The silicon nitride film 111 serves as an etching stopper when contact holes toward the source/drain regions are formed.

The interlayer insulating film 11 was planarized by using CMP technology, and the remaining oxide film 11, and the nitride film 111 when required, were etched back to expose the surface of the silicon nitride film 25 on the poly-Si film. In this state, only the silicon nitride film 25 was selectively etched back over the interlayer insulating film 11, which was an oxide film, and the gate sidewalls 7, so that the poly-Si 4 was completely recessed as shown in FIG. 6(g). There was thus formed a recess above the poly-Si 4, the recess having a height H of approximately 80 nm from the top surface of the poly-Si 4 to the top portions 41 of the gate sidewalls 7 (exposing process).

Figure 7:
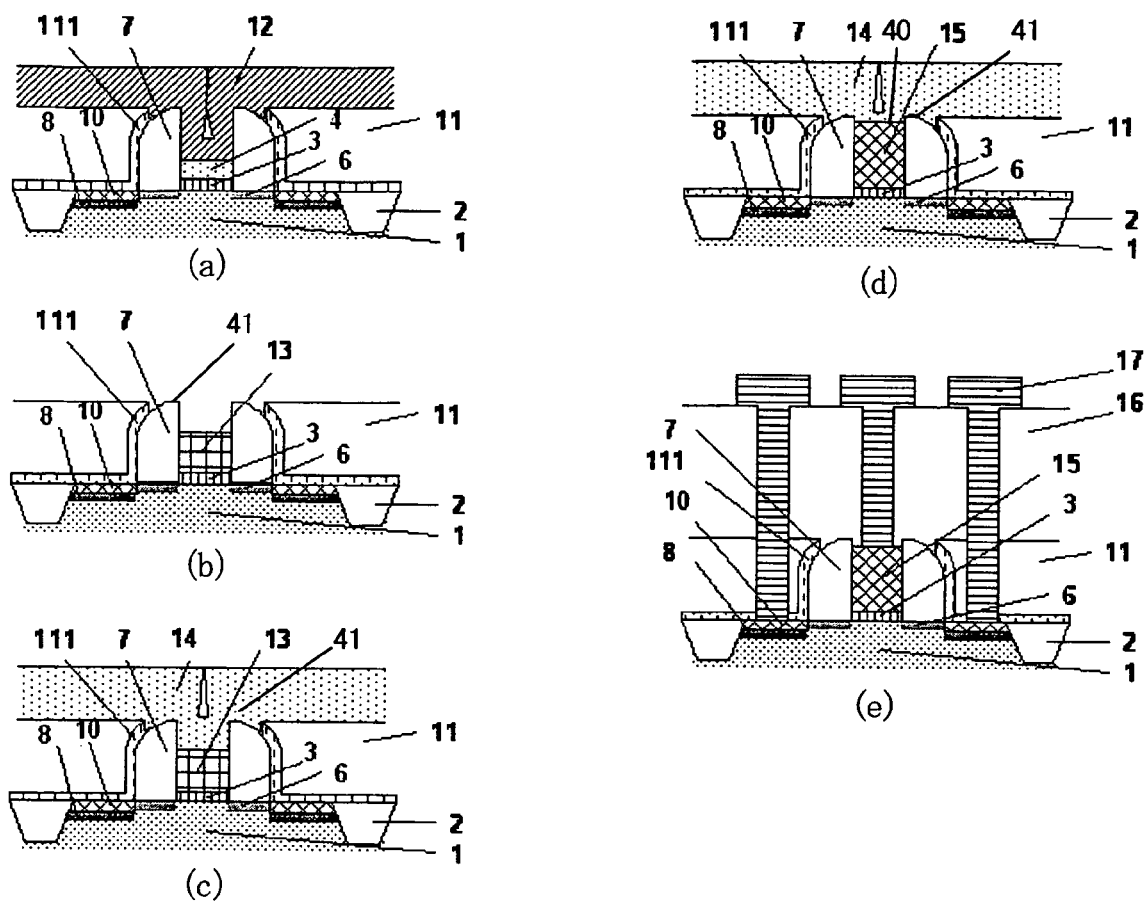
FIG. 7 shows processes for manufacturing a semiconductor device according to the second exemplary embodiment of the present invention.

Then, Ni (metal M1) was deposited as a metal film 12 for forming silicide with the poly-Si 4 (first deposition process). In this exemplary embodiment, DC magnetron sputtering was used to form the Ni film to a thickness of 60 nm at room temperature. As shown in FIG. 7(a), since the depth of the recess is as deep as 80 nm, the Ni to be deposited immediately above the poly-Si 4 will be only 60 nm or thinner when the gate length is on the order of 50 nm. However, since the Ni deposited on the sidewalls of the recess also contributes to the silicidation reaction, enough Ni is present even in such a case. It is therefore possible to convert the entire poly-Si 4 into the $Ni_3Si$ crystalline phase.

Subsequently, as in the first exemplary embodiment, to initiate a reaction between the poly-Si 4 on the gate insulating film and the Ni 12, heat treatment was carried out at 400° C. for two minutes to form an $Ni_3Si$ crystalline phase region (1) 13 (first alloying process; y1/x1=1/3), and the excess Ni film was removed by wet etching. As shown in FIG. 7(b), since the volume expansion associated with the $Ni_3Si$ silicidation is approximately 2.1 times, the height of the $Ni_3Si$ crystalline phase region (1) 13 is approximately 65 nm, so that the top surface of the $Ni_3Si$ crystalline phase region (1) 13 is lower than the top portions 41 of the gate sidewalls 7.

Further, an additional silicon layer (second region: the component S1 was silicon) 14 was stacked (second deposition process), as in the first exemplary embodiment. In this exemplary embodiment, as shown in FIG. 7(c), the additional silicon layer 14 that can react with the $Ni_3Si$ crystalline phase region (1) 13 is present only above the $Ni_3Si$ crystalline phase region (1) 13. Therefore, the thickness of the additional silicon layer 14 needs to be set to a value greater than twice the thickness of the initial poly-Si 4. In practice, however, as shown in the figure, since the film formation is carried out in the recess having an aspect ratio of approximately one, the additional silicon layer 14 is desirably provided to a thickness at which the portion immediately above the $Ni_3Si$ crystalline phase region (1) 13 sandwiched between the gate sidewalls is almost completely filled. In this exemplary embodiment, this shape was achieved by using room-temperature sputtering to deposit the additional silicon layer 14 having a thickness of 75 nm, which was 2.5 times the thickness of the initial poly-Si 4.

Then, as in the first exemplary embodiment, heat treatment was carried out at 400° C. for five minutes to initiate a reaction between the additional silicon layer 14 and the $Ni_3Si$ crystalline phase region (1) 13 so as to convert them into an NiSi crystalline phase region (2) 15 (second alloying process; y2/x2=1). Although the volume of the NiSi crystalline phase region (2) 15 according to this exemplary embodiment is approximately 3.5 times the volume of the initial poly-Si 4, in this embodiment, as shown in FIG. 7(d), the height of the gate sidewalls has been set to 110 nm, approximately 3.7 times the height of the poly-Si 4, which is 30 nm. Therefore, the entire NiSi crystalline phase region (2) 15 to be formed is sandwiched between the gate sidewalls 7 (the top surface 40 of the NiSi crystalline phase region (2) 15 is lower than the top portion 41 of the gate sidewalls). Therefore, unlike the first exemplary embodiment in which the width of the resultant NiSi crystalline phase region (2) 15 is greater than the gate length, it is possible to completely prevent a short circuit with source/drain contacts 17.

Further, as in the first exemplary embodiment, the removal of the additional silicon layer 14 by wet etching, the formation of an interlayer insulating film 16, and the formation of a contact plug 17 were carried out, and the MOS having the structure shown in FIG. 7(e) was finally provided. Throughout the above processes, no separation of the silicide electrode was observed.

The data fields in the "Second exemplary embodiment" row in Table 1 show the average of and variation in threshold voltage ($V_{th}$) of the nMOS with the NiSi gate electrode obtained by using this embodiment, the gate electrode having a gate length of 0.05 μm. The data indicate that the NiSi crystalline phase gate electrode obtained by using this exemplary embodiment, although having a short gate length, has uniformity comparable to that of the n+poly-Si gate electrode. Further, from the value of $V_{th}$, the effective work function is expected to be 4.5 eV, which substantially coincides with the effective work function of the NiSi gate electrode on an HfSiON gate insulating film. It can thus be said that in the NiSi gate electrode obtained by using this exemplary embodiment, although it is a very narrow gate electrode, a uniform NiSi crystalline phase has been formed. Further, in the nMOS of this exemplary embodiment, the gate electrode can be prevented from depletion and the gate leak current can effectively be reduced as compared to that in the MOS with the n+poly-Si gate electrode.

Further, this exemplary embodiment shows that the composition of the gate electrode is controlled in a satisfactory manner even when the poly-Si film having a significantly small thickness of 30 nm is formed before the first alloying process, which seems to be impossible by using the method disclosed in the non-patent reference 4. According to the present invention, since the crystalline phase can be controlled in theory even when a further thinner poly-Si film is formed before the first alloying process, the present invention can be implemented without deteriorating the filling characteristics of the additional silicon even when the gate length becomes even smaller.

Third Exemplary Embodiment

FIGS. 8(a) to 8(d), FIGS. 9(a) to 9(c), FIGS. 10(a) to 10(c), and FIGS. 11(a) to 11(c) show an exemplary embodiment of the processes for manufacturing a semiconductor device with a pMOS and an nMOS of the present invention. These figures are cross-sectional views showing processes for separately fabricating a silicide electrode having a high content of a metal (first alloy) in the pMOS and a silicide electrode having a high content of Si (second alloy) in the nMOS. In this exemplary embodiment, Ni silicide was used as the silicide electrode. Specifically, the $Ni_3Si$ crystalline phase was formed as the silicide having a high content of a metal (first alloy), and the NiSi crystalline phase was formed as the silicide having a high content of Si (second alloy).

FIGS. 8(a) to 8(d), FIGS. 9(a) to 9(c), and FIGS. 10(a) and 10(b) show that the same processes as those shown in FIGS. 6(a) to 6(g) and FIGS. 7(a) and 7(b) in the second exemplary embodiment are carried out for both the pMOS and nMOS regions.

That is, first, a silicon substrate 1 including an n-type semiconductor region (n-type region; n-type active region; n-well) and a p-type semiconductor region (p-type region; p-type active region; p-well) was prepared. Then, STI (Shallow Trench Isolation) technology was used to form isolation regions 2 in the surface area of the silicon substrate 1 in such a way that the n-type semiconductor region is isolated from the p-type semiconductor region. A gate insulating film 3 was subsequently formed on the surface of the isolated silicon substrate (FIG. 8(a)).

Then, a stacked film formed of a 60 nm-thick poly-Si film (polysilicon film: first region: the component S1 was silicon) 4 and a 100 nm-thick silicon nitride film 25 (mask) was formed in such a way that they jutted out from the gate insulating film 3. The stacked film was processed by using lithography technology and RIE (Reactive Ion Etching) technology. In this process, the gate insulating film 3, the poly-Si film 4, and the silicon nitride film 25 jutting out from the n-type semiconductor region were formed in this order (formation process). Similarly, the gate insulating film 3, the poly-Si film 4, and the silicon nitride film 25 jutting out from the p-type semiconductor region were formed in this order (FIG. 8(b)). Subsequently, ion implantation was carried out to form extension diffusion layer regions 6 in a self-alignment manner by using the silicon nitride films 25 as a mask.

Figure 8:
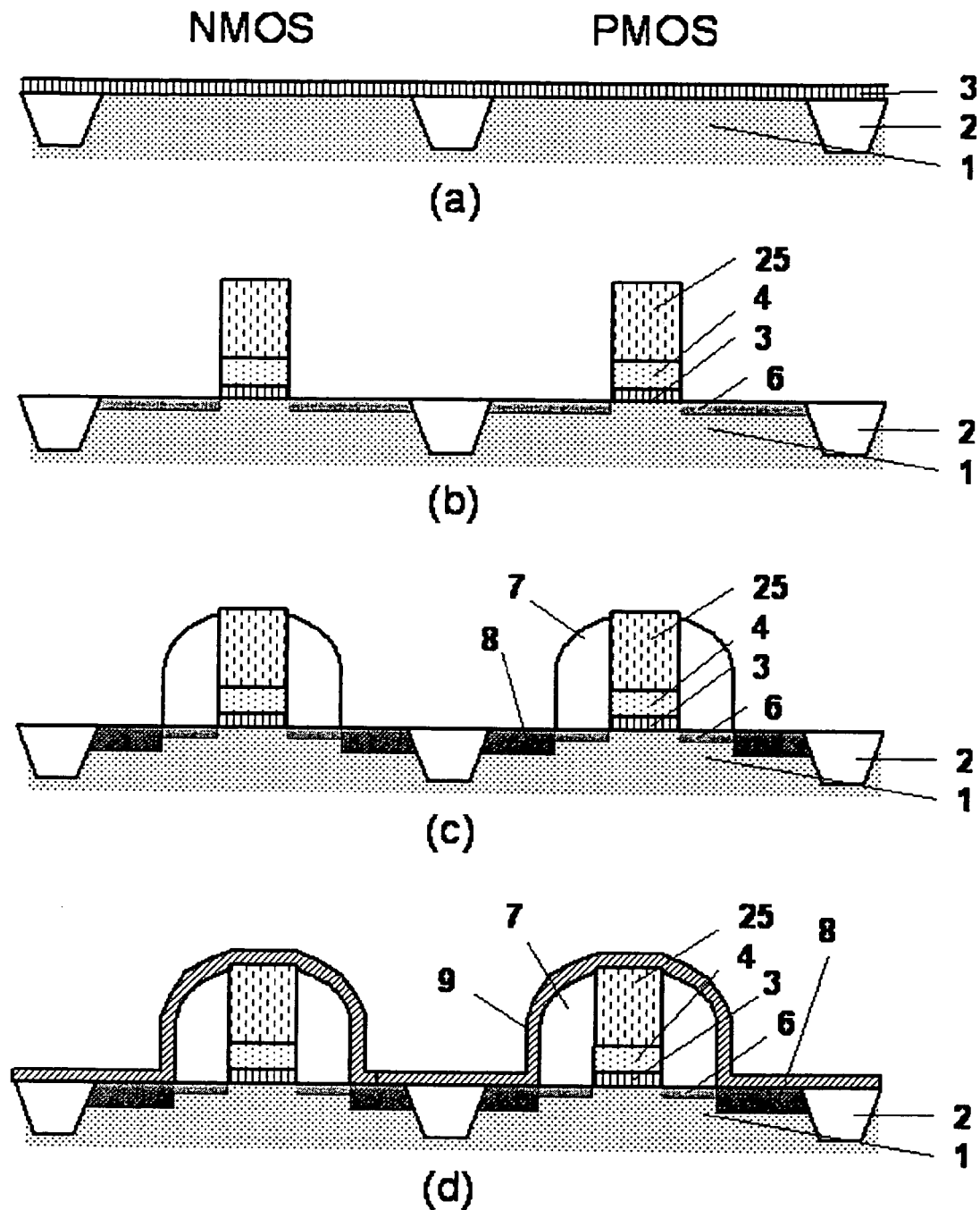
FIG. 8 shows processes for manufacturing a semiconductor device according to a third exemplary embodiment of the present invention.

Further, a silicon oxide film was deposited and then etched back to form gate sidewalls 7 on both sides of the gate insulating film 3, poly-Si film 4, and silicon nitride film 25 jutting out from the p-type semiconductor region and the n-type semiconductor region (FIG. 8(c)). In this state, ion implantation was carried out again, followed by activation anneal, so that source/drain diffusion regions 8 were formed in the n-type semiconductor region on both sides of the poly-Si film 4 and in the p-type semiconductor region both sides of the poly-Si film 4.

Then, as shown in FIG. 8(d), a 20 nm-thick metal film 9 was deposited on the entire surface by using sputtering, and the first region, the gate sidewalls, and the STI were used as a mask to form silicide layers 10 approximately 20 nm thick only on the source/drain diffusion regions 8 by using salicide technology. Then, the excess metal film 9 was selectively removed by wet etching (FIG. 9(a)). The silicide layer 10 was Ni monosilicide (NiSi) that can minimize the contact resistance. The Ni silicide may be replaced with Co silicide or Ti silicide.

Figure 9:
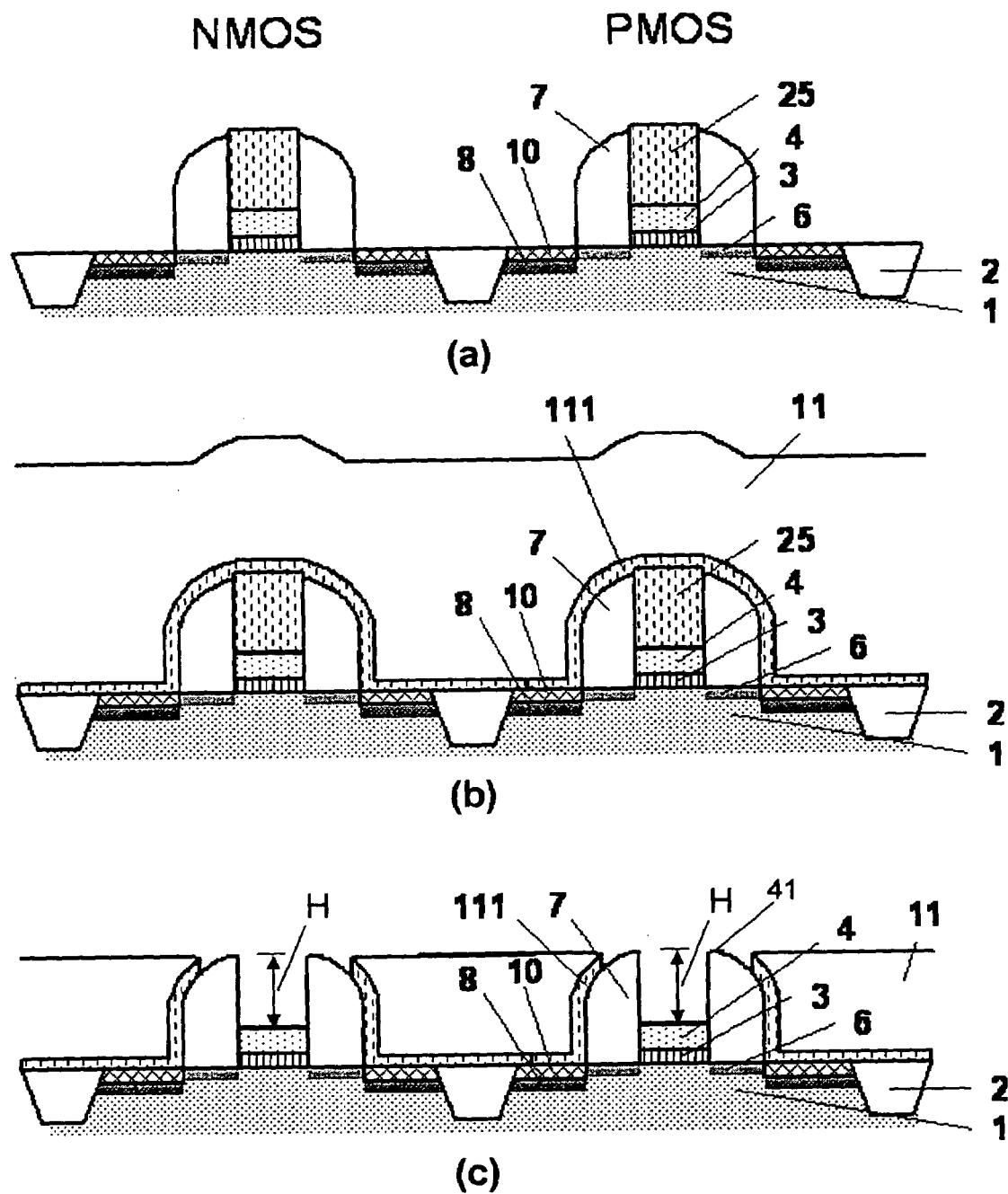
FIG. 9 shows processes for manufacturing a semiconductor device according to the third exemplary embodiment of the present invention.

Further, as shown in FIG. 9(b), after an interlayer insulating film 111, which was a nitride film, was deposited on the entire surface, an interlayer insulating film 11 formed of a 500 nm-thick silicon oxide film was formed by using CVD (Chemical Vapor Deposition). The interlayer insulating film 111, which was a nitride film, and the interlayer insulating film 11, which was a silicon oxide film, were planarized by using CMP technology, and the remaining oxide film 11 and nitride film 111 were etched back to expose the surface of the silicon nitride film 25 on the poly-Si film. In this state, only the silicon nitride film 25 was selectively etched back over the interlayer insulating film 11, which was an oxide film, and the gate sidewalls 7, so that the poly-Si 4 was completely recessed as shown in FIG. 9(c). There was thus provided a recess, the recess having a height H of approximately 80 nm from the top surface of the poly-Si 4 to the top portions 41 of the gate sidewalls 7 (exposing process).

Then, Ni (metal M1) was deposited as a metal film 12 for forming silicide with the poly-Si 4 (first deposition process). The Ni film was formed as a layer containing an amount of metal M1 more than metal M1 necessary to convert the two first regions deposited on the n-type and p-type semiconductor regions into the $Ni_3Si$ crystalline phase. In this exemplary embodiment, DC magnetron sputtering was used to form the Ni film to a thickness of 60 nm at room temperature (FIG. 10(a)).

Figure 10:
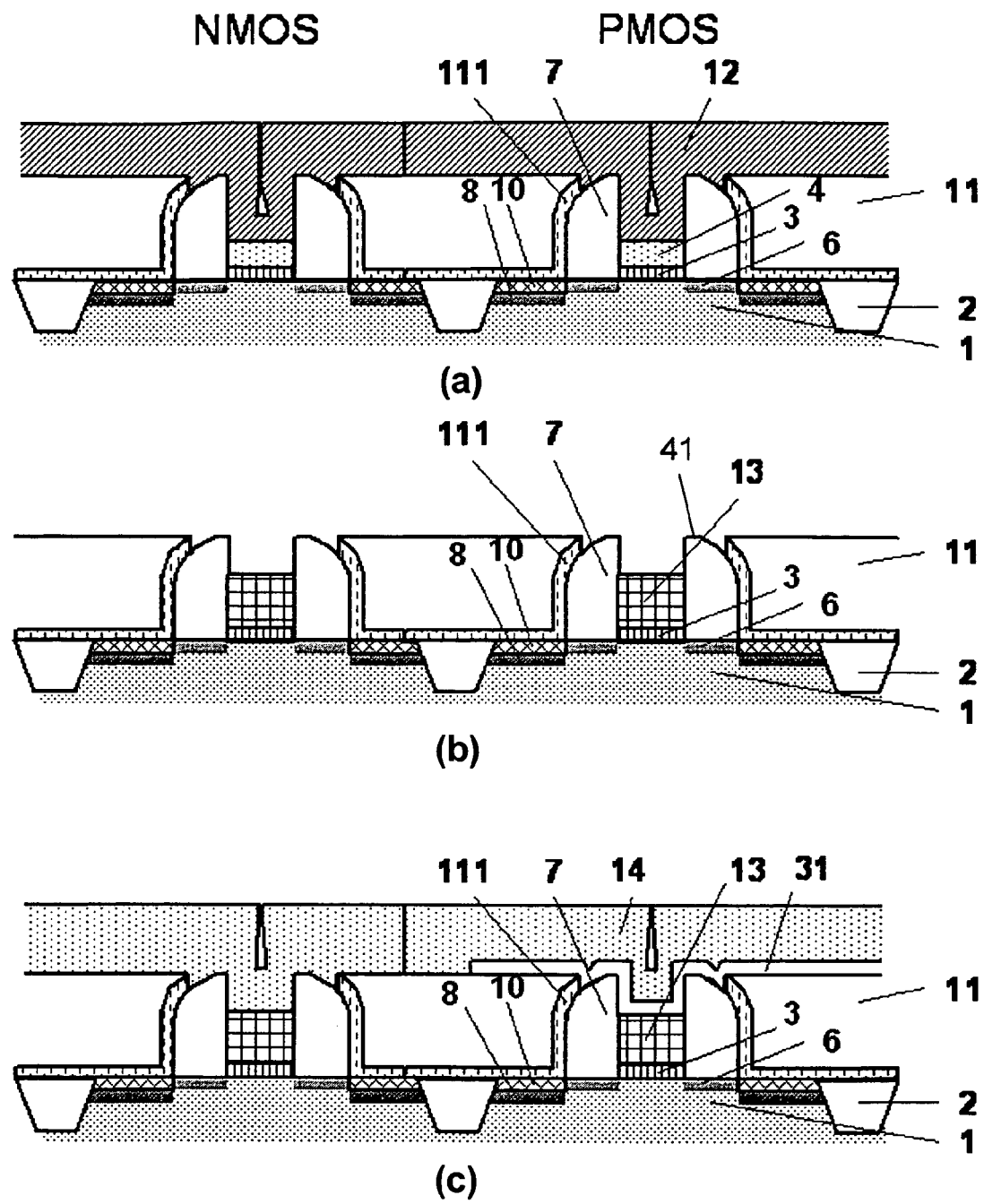
FIG. 10 shows processes for manufacturing a semiconductor device according to the third exemplary embodiment of the present invention.

Subsequently, as in the first exemplary embodiment, a reaction was initiated between the poly-Si 4 on the gate insulating film and the Ni 12. That is, heat treatment was carried out at 400° C. for two minutes to form $Ni_3Si$ crystalline phase regions (1) 13 on the n-type and p-type semiconductor regions (first alloying process; y1/x1=1/3). As shown in FIG. 10(b), since the volume expansion associated with the $Ni_3Si$ silicidation is approximately 2.1 times, the height of the $Ni_3Si$ crystalline phase region (1) 13 is approximately 65 nm, so that the top surface of the $Ni_3Si$ crystalline phase region (1) 13 is lower than the top portions 41 of the gate sidewalls 7. Then, the excess Ni film was removed by wet etching.

Then, as shown in FIG. 10(c), the exposed portion of the region (1), which has become the first alloy in the first alloying process, on the n-type semiconductor region was covered with an reaction barrier layer 31. In this exemplary embodiment, a 10 nm-thick oxide film was processed by using dry etching to form the reaction barrier layer (cap film). The material of the reaction barrier layer 31 is not particularly specified as long as the material has a function of preventing the reaction between the additional silicon 14 and the $Ni_3Si$ crystalline phase region (1) 13 (y1/x1=1/3). The material is also required to be selectively etched over the silicide electrode.

Then, as shown in FIG. 10(c), an additional silicon layer (second region: the component S1 was silicon) 14 was deposited in such a way that the additional silicon layer came into contact with at least part of the region (1) made of the first alloy jutting out from the p-type semiconductor region (second deposition process). The additional silicon layer 14 contains an amount of component Si more than component Si necessary to convert the entire $Ni_3Si$ crystalline phase region 13 jutting out from the p-type semiconductor region into NiSi through a reaction between the additional silicon layer 14 and the $Ni_3Si$ crystalline phase region (1) 13 jutting out from the p-type semiconductor region. The additional silicon layer therefore needs to contain silicon atoms greater than twice the number of silicon atoms in the poly-Si 4 formed in the previous process in such a way that it juts out from the p-type semiconductor region.

Figure 11:
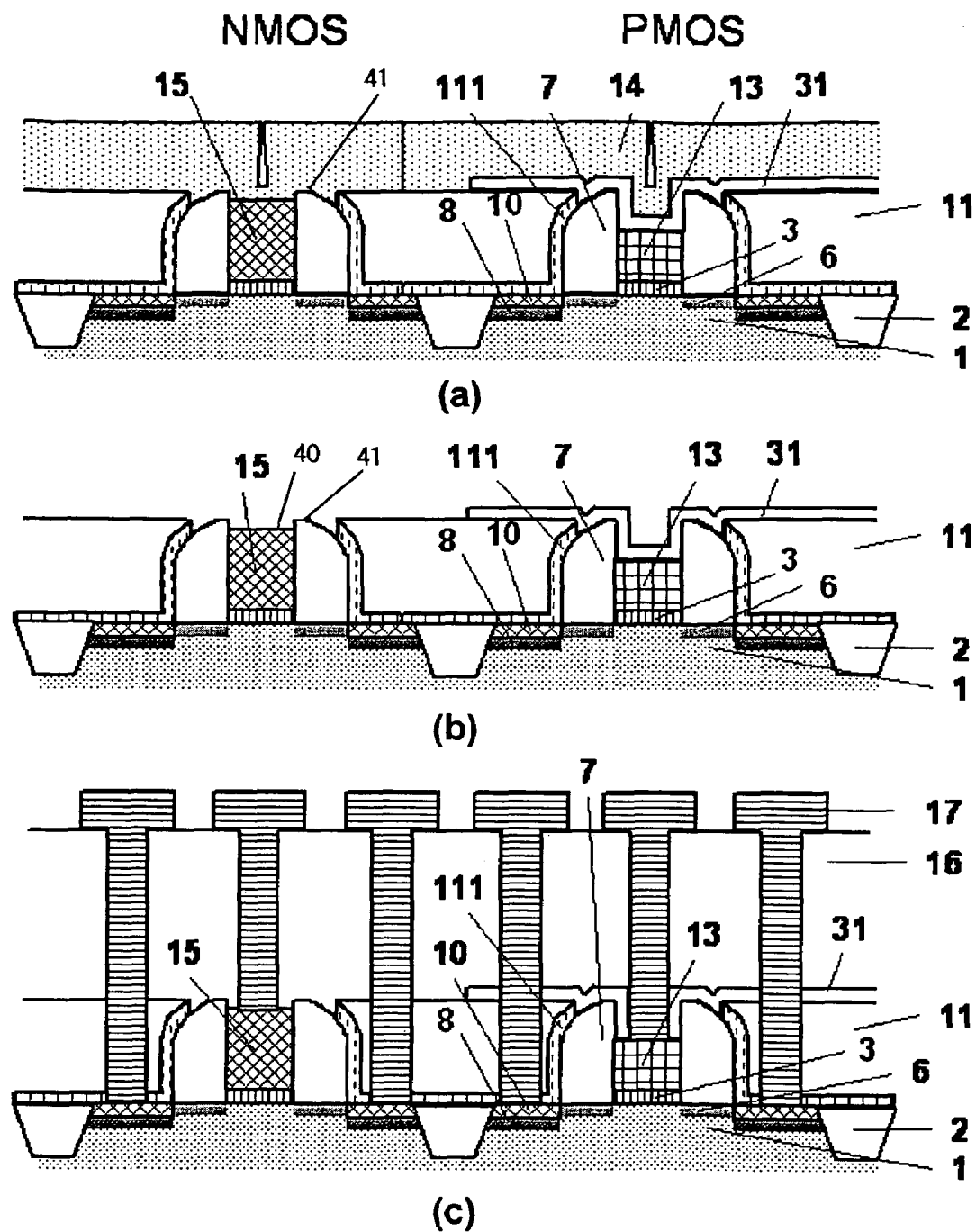
FIG. 11 shows processes for manufacturing a semiconductor device according to the third exemplary embodiment of the present invention.

Then, as in the second exemplary embodiment, a reaction was initiated between the additional silicon layer 14 and the $Ni_3Si$ crystalline phase region (1) 13 jutting out from the p-type semiconductor region to convert them into an NiSi crystalline phase region (2) 15 (y2/x2=1) (second alloying process), as shown in FIGS. 11(a) and 11(b). This reaction was carried out through heat treatment at 400° C. for five minutes. Then, wet etching was carried out to remove the additional silicon layer 14 that has not reacted. The conditions for carrying out the wet etching are the same as those in the second exemplary embodiment. As a result, the NiSi crystalline phase gate electrode 15, as shown in FIG. 7(d) of the second exemplary embodiment, is formed on the p-type semiconductor region, whereas the $Ni_3Si$ crystalline phase gate electrode 13 remains unreacted on the n-type semiconductor region covered with the reaction barrier layer 31. The top surface 40 of the NiSi crystalline phase gate electrode 15 is lower than the top portions 41 of the gate sidewalls. Further, the additional silicon layer 14 left unreacted was removed by wet etching using a 22 mass % tetramethyl ammonium hydroxide solution.

Finally, the formation of an interlayer insulating film 16 and the formation of a contact plug 17 were carried out, and the nMOS and PMOS having the structure shown in FIG. 11(c) were provided. Since the reaction barrier layer 31 is significantly thinner than the interlayer insulating film 16, the reaction barrier layer 31 may not be removed before the formation of the interlayer insulating film 16. Throughout the above processes, no separation of the silicide electrode was observed.

The data fields in the "Third exemplary embodiment" row in Table 1 show the average of and variation in threshold voltage ($V_{th}$) of the nMOS with the NiSi crystalline phase gate electrode and the pMOS with the $Ni_3Si$ crystalline phase gate electrode obtained by using this exemplary embodiment, each of the gate electrodes having a gate length of 0.05 μm. The data indicates that the NiSi crystalline phase gate electrode (for the nMOS) and the $Ni_3Si$ crystalline phase gate electrode (for the pMOS) obtained by using this exemplary embodiment, although each gate electrode having a short gate length, have uniformity comparable to those of the nMOS with the n+poly-Si gate electrode and the pMOS with the p+poly-Si gate electrode. Further, from the values of $V_{th}$, the effective work functions of NiSi and $Ni_3Si$ are expected to be 4.5 eV and 4.8 eV, respectively, which substantially coincide with the effective work functions of the NiSi and $Ni_3Si$ crystalline phase electrodes on an HfSiON gate insulating film. As a result, by adjusting $V_{th}$ (threshold voltage) according to the characteristics of the nMOS and pMOS and effectively reducing the impurity concentration in the channel region, the processing speed of the CMOS can be increased.

Further, in the very narrow gate electrodes obtained by using this exemplary embodiment, uniform NiSi and $Ni_3Si$ crystalline phases have been formed. Moreover, in the CMOS with the nMOS and PMOS of this exemplary embodiment as well, the gate leak current can effectively be reduced as compared to that in the MOS with the n+poly-Si gate electrode.

The semiconductor device described above may be a CMOS transistor in which nMOS and pMOS are mixed.

Fourth Exemplary Embodiment

In this exemplary embodiment, unlike the first to third exemplary embodiments, poly-$Si_{0.7}Ge_{0.3}$ (first region) and additional $Si_{0.7}Ge_{0.3}$ (second region) were formed instead of the poly-Si 4 and the additional silicon 14. Ni (metal M1) was deposited as the metal layer. Specifically, an gate electrode made of the $Ni_3(Si_{0.7}Ge_{0.3})$ crystalline phase having a high content of a metal (first alloy) was fabricated in the pMOS, and an gate electrode made of the $Ni(Si_{0.7}Ge_{0.3})$ crystalline phase having a high content of SiGe (second alloy) was fabricated in the nMOS.

Since the $Ni_3Ge$ crystalline phase, $Ni_2Ge$ crystalline phase, and NiGe crystalline phase have been identified as alloys of Ni and Ge as well as the Ni silicide, it is possible in this exemplary embodiment to separately fabricate crystalline phases having different Ge contents by using the mechanism identical to that used in the Ni silicide. Therefore, different crystalline phases can be fabricated in a manner similar to the above exemplary embodiments even when the first and second regions are made of $Si_{0.7}Ge_{0.3}$ (the component Si is $Si_{0.7}Ge_{0.3}$). More generally speaking, when the first and second regions are made of $Si_xGe_{1-x}$, an $Ni_3Si_xGe_{1-x}$ crystalline phase, $Ni_2Si_xGe_{1-x}$ crystalline phase, and $NiSi_xGe_{1-x}$ crystalline phase can be separately fabricated. The process diagram in this case is identical to that in the third exemplary embodiment and hence omitted.

The data fields in the "Fourth exemplary embodiment" row in Table 1 show the average of and variation in threshold voltage ($V_{th}$) of the nMOS with the $Ni(Si_{0.7}Ge_{0.3})$ crystalline phase gate electrode and the pMOS with the $Ni_3(Si_{0.7}Ge_{0.3})$ crystalline phase gate electrode obtained by using this exemplary embodiment, each of the gate electrodes having a gate length of 0.05 μm. Table 1 shows that the variation in $V_{th}$ is sufficiently small even when the gate length is short. Further, from the values of $V_{th}$, the effective work functions of $Ni(Si_{0.7}Ge_{0.3})$ and $Ni_3(Si_{0.7}Ge_{0.3})$ are expected to be 4.5 eV and 4.9 eV, respectively. The effective work function of the $Ni_3(Si_{0.7}Ge_{0.3})$ gate electrode used on the pMOS side is greater than the effective work function of the $Ni_3Si$ crystalline phase gate electrode (4.8 eV) by approximately 0.1 eV. There is thus an advantage of reducing $V_{th}$ from −0.45 V to −0.36 V accordingly.

Fifth Exemplary Embodiment

In this exemplary embodiment, the silicide having a high content of a metal (first alloy) formed through a reaction between the poly-Si (first region) 4 and the Ni (metal M1) 12 is the $Ni_2Si$ crystalline phase (y1/x1=1/2). The processes identical to those in the second exemplary embodiment can be used except the following points. Since the temperature at which the $Ni_2Si$ crystalline phase is stable is lower than the temperature at which the $Ni_3Si$ crystalline phase is stable, and at such a temperature, the speed at which the silicidation proceeds is lower, the heat treatment was carried out at 280° C. for ten minutes to fully convert the poly-Si 4 into the $Ni_2Si$ crystalline phase (first alloying process).

The volume of the NiSi crystalline phase (y2/x2=1:second alloy) obtained through a reaction between the $Ni_2Si$ crystalline phase and the additional silicon 14 is 2.2 times the volume of the initial poly-Si 4. Therefore, to form the gate electrode in such a way that the final NiSi crystalline phase formed by carrying out the second alloying process is not higher than the top portions of the gate sidewalls, it is necessary to set the film thickness of the silicon nitride film (mask) 25 to 36 nm or more. In this exemplary embodiment, the film thickness of silicon nitride film was set to 50 nm in consideration of margin. Further, the film thickness of the additional silicon (second region) 14 for obtaining the NiSi crystalline phase from the $Ni_2Si$ crystalline phase needs to be 30 nm or more, which is the thickness of the initial poly-Si 4. In this exemplary embodiment, the film thickness of the additional silicon was set to 50 nm.

The data fields in the "Fifth exemplary embodiment" row in Table 1 show the average of and variation in threshold voltage ($V_{th}$) of the nMOS with the NiSi crystalline phase gate electrode obtained by using this embodiment, the gate electrode having a gate length of 0.05 μm. The variation in $V_{th}$ and the average $V_{th}$ are comparable to those obtained in the second exemplary embodiment. It can thus be said that a uniform NiSi crystalline phase has been formed in the very narrow gate electrode obtained by using this exemplary embodiment. The advantage of this exemplary embodiment is that the Ni 12 and the additional silicon 14 can be more easily filled into the recess because it is not necessary to set the film thickness values of the silicon nitride film 25 and the additional silicon 14 (mask) to very large values.

Although not shown in this exemplary embodiment, it is possible to carry out the processes shown in the third exemplary embodiment based on the method in this exemplary embodiment so as to separately fabricate the NiSi crystalline phase gate electrode (second alloy) for the nMOS and the $Ni_2Si$ crystalline phase gate electrode (first alloy) for the pMOS.

Sixth Exemplary Embodiment

In this embodiment, the silicide having a high content of Si formed through a reaction between the $Ni_3Si$ crystalline phase (first alloy; y1/x1=1/3) and the additional silicon (second region) 14 is the $NiSi_2$ crystalline phase (second alloy; y2/x2=2). The processes identical to those in the second exemplary embodiment can be used except the following points. Since the temperature at which the $NiSi_2$ crystalline phase is stable is higher than the temperature at which the NiSi crystalline phase is stable, the heat treatment was carried out at 650° C. for two minutes to fully convert the $Ni_3Si$ crystalline phase region (1) 13 into the $NiSi_2$ crystalline phase (first alloying process). In the heat treatment, since the silicide layers provided on the source/drain regions required heat resistance, Co silicide was used. The volume of the $NiSi_2$ crystalline phase obtained through a reaction between the $Ni_3Si$ crystalline phase and the additional silicon 14 is approximately 3.9 times the volume of the initial poly-Si 4. Therefore, to form the gate electrode in such a way that the final NiSi crystalline phase is not higher than the top portions of the gate sidewalls in the second alloying process, it is necessary to set the film thickness of the silicon nitride film (mask) 25 to 90 nm or more. In this exemplary embodiment, the film thickness of the silicon nitride film was set to 100 nm in consideration of margin. Further, the film thickness of the additional silicon 14 for obtaining the $NiSi_2$ crystalline phase from the $Ni_3Si$ crystalline phase needs to be 90 nm or more, which is three times the thickness of the initial poly-Si 4. In this exemplary embodiment, the film thickness of the additional silicon was set to 100 nm.

The data fields in the "Sixth exemplary embodiment" in Table 1 show the average of and variation in threshold voltage ($V_{th}$) of the nMOS with the $NiSi_2$ crystalline phase gate electrode obtained by using this embodiment, the gate electrode having a gate length of 0.05 μm. The variation in $V_{th}$ is within tolerance although it is slightly worse than those for the NiSi crystalline phase gate electrodes in the other exemplary embodiments. The effective work function is calculated to be 4.4 eV from the average $V_{th}$. It can thus be said that a uniform $NiSi_2$ crystalline phase has been formed in the very narrow gate electrode obtained by using this exemplary embodiment. The advantage of this exemplary embodiment is that the use of the $NiSi_2$ crystalline phase reduces $V_{th}$ as compared to that in the NiSi crystalline phase.

Although not shown in this exemplary embodiment, it is possible to carry out the processes shown in the third embodiment based on this exemplary embodiment so as to separately fabricate the $NiSi_2$ crystalline phase (second alloy) gate electrode for the nMOS and the $Ni_3Si$ crystalline phase (first alloy) gate electrode for the pMOS.

While the exemplary embodiments of the present invention have been described above, the present invention is not limited thereto, but can be implemented by selecting materials and structures to the extent that they do not depart from the spirit of the present invention.

For example, the combination of the metal element for converting the gate electrode into silicide and the metal element used in the silicide layers provided on the source/drain diffusion layers needs to be selected in consideration of the temperature range within which the silicide layers on the source/drain diffusion layers are not modified as described in the first exemplary embodiment. It is also necessary to satisfy the condition that poly-Si for the gate electrode can be converted into silicide. Even a metal difficult to be silicided at low temperatures can, however, be silicided by carrying out extended heat treatment. The desired advantageous effect can therefore be provided by adjusting the conditions, such as the heat treatment temperature and time and appropriately selecting the silicide metal for the source/drain diffusion layers according to the combination of the silicide metal elements described above.

Further, the silicidation temperature can be lowered in a skillful manner, for example, by replacing poly-Si with amorphous Si and adjusting the temperature at which the metal used in silicidation is deposited. These techniques can be used at the same time as required to achieve a preferable combination. Moreover, since the stoichiometric composition ratio of the metal-rich phase to the Si-rich phase, which is automatically obtained and most stable in the temperature ranges described above, varies according to silicide material, it is necessary to select these conditions as appropriate.

TABLE 1

| | | nMOS | | | pMOS | |
|---|---|---|---|---|---|---|
| | Gate electrode | Average $V_{th}$ (V) | Variation in $V_{th}$ (3σ) (mV) | Gate electrode | Average $V_{th}$ (V) | Variation in $V_{th}$ (3σ) (mV) |
| First Exemplary Embodiment | n + poly-Si | 0.48 | 9 | | | |
| | NiSi | 0.48 | 12 | | | |
| Second Exemplary Embodiment | NiSi | 0.48 | 14 | | | |
| Third Exemplary Embodiment | NiSi | 0.48 | 9 | $Ni_3Si$ | −0.45 | 13 |

TABLE 1-continued

| | nMOS | | | pMOS | | |
|---|---|---|---|---|---|---|
| | Gate electrode | Average $V_{th}$ (V) | Variation in $V_{th}$ (3σ) (mV) | Gate electrode | Average $V_{th}$ (V) | Variation in $V_{th}$ (3σ) (mV) |
| Fourth Exemplary Embodiment | Ni ($Si_{0.7}Ge_{0.3}$) | 0.50 | 12 | $Ni_3(Si_{0.7}Ge_{0.3})$ | −0.36 | 10 |
| Fifth Exemplary Embodiment | NiSi | 0.48 | 10 | | | |
| Sixth Exemplary Embodiment | $NiSi_2$ | 0.41 | 19 | | | |

The invention claimed is:

1. A method for manufacturing a semiconductor device with a MOS transistor, comprising:
    forming a gate insulating film, a first region made of a component S1, and a mask in this order in such a way that the gate insulating film, the first region, and the mask jut out from a semiconductor layer;
    providing gate sidewalls on both sides of the gate insulating film, the first region, and the mask;
    forming source/drain regions in the semiconductor layer on both sides of the first region;
    exposing the first region by removing the mask;
    depositing a metal layer at least on the exposed first region, the metal layer containing an amount of metal M1 more than an amount of metal M1 necessary to react to all the component S1 in the first region to form a first alloy made of a crystalline phase expressed by $M1_{x1}S1_{y1}$ (x1 and y1 are natural numbers);
    converting the entire first region into a region (1) made of the first alloy through a reaction between the component S1 in the first region and the metal M1 using heat treatment;
    removing the metal layer containing the metal M1 that has not reacted with the component S1 in the converting of the entire first region into the region (1);
    depositing a second region in such a way that the second region comes into contact with at least part of the region (1), the second region containing an amount of component S1 more than an amount of component S1 necessary to react to all the first alloy to form a second alloy made of a crystalline phase expressed by $M1_{x2}S1_{y2}$ (x2 and y2 are natural numbers, y2/x2>y1/x1);
    converting the entire region (1) into a region (2) made of the second alloy to form a gate electrode through a reaction between the component S1 in the second region and the first alloy by using heat treatment; and
    removing the second region made of the component S1 that has not reacted with the first alloy in the converting of the entire region (1) into the region (2).

2. A method for manufacturing a semiconductor device with an n-type MOS transistor and a p-type MOS transistor, comprising:
    preparing a semiconductor layer including an n-type semiconductor region and a p-type semiconductor region insulatively spaced from each other with an isolation region therebetween;
    forming a gate insulating film, a first region made of a component S1, and a mask in this order in such a way that the gate insulating film, the first region, and the mask jut out from the n-type semiconductor region, and
    forming a gate insulating film, a first region made of a component S1, and a mask in this order such that the gate insulating film, the first region, and the mask jut out from the p-type semiconductor region;
    providing gate sidewalls on both sides of the gate insulating film, the first region, and the mask that jut out from the n-type semiconductor region, and on both sides of the gate insulating film, the first region, and the mask that jut out from the p-type semiconductor region;
    forming source/drain regions in the n-type semiconductor region on both sides of the first region and in the p-type semiconductor region on both sides of the first region, respectively;
    exposing first regions that jut out from the n-type semiconductor region and the p-type semiconductor region by removing masks;
    depositing metal layer at least on the exposed first regions, the metal layer containing an amount of metal M1 more than an amount of metal M1 necessary to react to all the component S1 in the first regions to form a first alloy made of a crystalline phase expressed by $M1_{x1}S1_{y1}$ (x1 and y1 are natural numbers);
    converting the entire first regions, which jut out from the n-type semiconductor region and the p-type semiconductor region, into regions (1) made of the first alloy through a reaction between the component S1 in the first regions and the metal M1 by using heat treatment;
    removing the metal layer containing the metal M1 that has not reacted with the component S1 in the converting of the entire first regions into the regions (1) so as to expose the regions (1);
    forming a cap film to cover the exposed portion of the region (1) jutting out from the n-type semiconductor region;
    depositing a second region such that the second region comes into contact with at least part of the region (1) jutting out from the p-type semiconductor region, the second region containing an amount of component S1 more than an amount of component S1 necessary to react to all the first alloy in the region (1) jutting out from the p-type semiconductor region to form a second alloy made of a crystalline phase expressed by $M1_{x2}S1_{y2}$ (x2 and y2 are natural numbers, y2/x2>y1/x1);
    converting the entire region (1), which juts out from the p-type semiconductor region, into a region (2) made of the second alloy so as to form a gate electrode through a reaction between the component S1 in the second region and the first alloy by using heat treatment; and
    removing the second region made of the component S1 that has not reacted with the first alloy in the converting of the entire region (1) into the region (2).

3. The method for manufacturing a semiconductor device according to claim 1,
    wherein the gate sidewalls are not removed but left in the exposing the first region; and thicknesses of the first region and the mask are selected in the forming of the gate insulating film, the first region, and the mask, the composition of the first alloy is selected in the depositing of the metal layer and the converting of the entire first region into the region (1), and the composition of the second alloy is selected in the depositing of the second region and the converting of the entire region (1) into the region (2), such that the top surface of the gate electrode is set to a level lower than the top portions of the gate sidewalls.

4. The method for manufacturing a semiconductor device according to claim 1, wherein the gate insulating film contains Hf.

5. The method for manufacturing a semiconductor device according to claim 4, wherein the gate insulating film contains HfSiON.

6. The method for manufacturing a semiconductor device according to claim 1, wherein the component S1 is Si or Si containing impurities.

7. The method for manufacturing a semiconductor device according to claim 1, wherein the component S1 is $Si_zGe_{1-z}$ ($0<z<1$) or $Si_zGe_{1-z}$ ($0<z<1$) containing impurities.

8. The method for manufacturing a semiconductor device according to claim 1, wherein the metal M1 is Ni.

9. The method for manufacturing a semiconductor device according to claim 1, wherein
the first region made of Si is formed in the forming of the gate insulating film, the first region, and the mask,
an Ni layer having a thickness greater than 1.7 times the thickness of the first region is deposited as the metal layer in the depositing of the metal layer, and
the $Ni_3Si$ crystalline phase is formed as the first alloy in the converting of the entire first region into the region (1) by carrying out the heat treatment in which the first region and the metal layer are heated to a temperature ranging from 350 to 650° C.

10. The method for manufacturing a semiconductor device according to claim 1, wherein
the first region made of Si is formed in the forming of the gate insulating film, the first region, and the mask,
an Ni layer having a thickness greater than 1.1 times the thickness of the first region is deposited as the metal layer in the depositing of the metal layer, and
the $Ni_2Si$ crystalline phase is formed as the first alloy in the converting of the entire first region into the region (1) by carrying out the heat treatment in which the first region and the metal layer are heated to a temperature ranging from 240 to 300° C.

11. The method for manufacturing a semiconductor device according to claim 9, wherein
the second region made of Si and having a thickness greater than twice the thickness of the first region is deposited such that the second region comes into contact with the entire exposed portion of the region (1) in the depositing of the second region, and
the NiSi crystalline phase is formed as the second alloy in the converting of the entire region (1) into the region (2) by carrying out the heat treatment in which the second region and the region (1) are heated to a temperature ranging from 350 to 550° C.

12. The method for manufacturing a semiconductor device according to claim 10, wherein
the second region made of Si and having a thickness greater than the thickness of the first region is deposited such that the second region comes into contact with the entire exposed portion of the region (1) in the depositing of the second region, and
the NiSi crystalline phase is formed as the second alloy in the converting of the entire region (1) into the region (2) by carrying out the heat treatment in which the second region and the region (1) are heated to a temperature ranging from 350 to 550° C.

13. The method for manufacturing a semiconductor device according to claim 9, wherein
the second region made of Si and having a thickness greater than five times the thickness of the first region is deposited in such a way that the second region comes into contact with the entire exposed portion of the region (1) in the depositing of the second region, and
the $NiSi_2$ crystalline phase is formed as the second alloy in the converting of the entire region (1) into the region (2) by carrying out the heat treatment in which the second region and the region (1) are heated to a temperature ranging from 650 to 800° C.

14. The method for manufacturing a semiconductor device according to claim 10, wherein
the second region made of Si and having a thickness greater than twice the thickness of the first region is deposited such that the second region comes into contact with the entire exposed portion of the region (1) in the depositing of the second region, and
the $NiSi_2$ crystalline phase is formed as the second alloy in the converting of the entire region (1) into the region (2) by carrying out the heat treatment in which the second region and the region (1) are heated to a temperature ranging from 650 to 800° C.

15. The method for manufacturing a semiconductor device according to claim 1,
wherein the method further comprises the forming of nickel silicide layers on the source/drain regions after the forming of the source/drain regions,
the metal layer is deposited at 450° C. or lower in the depositing of the metal layer,
the second region is deposited at 450° C. or lower in the depositing of the second region, and
the heat treatment is carried out at 450° C. or lower in the converting of the entire first region into the region (1) and the converting of the entire region (1) into the region (2).

16. The method for manufacturing a semiconductor device according to claim 15, wherein the second region is deposited by using sputtering in the depositing of the second region.

17. The method for manufacturing a semiconductor device according to claim 1,
wherein the method further comprises the forming of cobalt silicide layers or titanium silicide layers on the source/drain regions after the forming of the source/drain regions,
the metal layer is deposited at 800° C. or lower in the depositing of the metal layer,
the second region is deposited at 800° C. or lower in the depositing of the second region, and
the heat treatment is carried out at 800° C. or lower in the converting of the entire first region into the region (1) and the converting of the entire region (1) into the region (2).

18. The method for manufacturing a semiconductor device according to claim 2,
wherein the gate sidewalls are not removed but left in the exposing of the first regions, and
thicknesses of the first regions and the masks are selected in the forming of the gate insulating films, the first regions, and the masks on the n-type semiconductor region and the p-type semiconductor region, the composition of the first alloy is selected in the depositing of the metal layer and the converting of the entire first regions into the regions (1), and the composition of the second alloy is selected in the depositing of the second region and the converting of the entire region (1) into the region (2), such that the top surface of the gate electrodes is set to a level lower than the top portions of the gate sidewalls.

19. The method for manufacturing a semiconductor device according to claim 2, wherein the gate insulating films of the n-type MOS transistor and the p-type MOS transistor contain Hf.

20. The method for manufacturing a semiconductor device according to claim 19, wherein the gate insulating films of the n-type MOS transistor and the p-type MOS transistor contain HfSiON.

21. The method for manufacturing a semiconductor device according to claim 2, wherein the component S1 is Si or Si containing impurities.

22. The method for manufacturing a semiconductor device according to claim 2, wherein the component S1 is $Si_zGe_{1-z}$ (0<z<1) or $Si_zGe_{1-z}$ (0<z<1) containing impurities.

23. The method for manufacturing a semiconductor device according to claim 2, wherein the metal M1 is Ni.

24. The method for manufacturing a semiconductor device according to claim 2, wherein
the first regions made of Si are formed in the forming of the gate insulating films, the first regions, and the masks on the n-type semiconductor region and the p-type semiconductor region,
an Ni layer having a thickness greater than 1.7 times the thickness of the first regions is deposited as the metal layer in the depositing of the metal layer, and
the $Ni_3Si$ crystalline phase is formed as the first alloy in the converting of the entire first regions into the regions (1) by carrying out the heat treatment in which the first regions and the metal layer are heated to a temperature ranging from 350 to 650° C.

25. The method for manufacturing a semiconductor device according to claim 2, wherein
the first regions made of Si are formed in the forming of the gate insulating films, the first regions, and the masks on the n-type semiconductor region and the p-type semiconductor region,
an Ni layer having a thickness greater than 1.1 times the thickness of the first regions is deposited as the metal layer in the depositing of the metal layer, and
the $Ni_2Si$ crystalline phase is formed as the first alloy in the converting of the entire first regions into the regions (1) by carrying out the heat treatment in which the first regions and the metal layer are heated to a temperature ranging from 240 to 300° C.

26. The method for manufacturing a semiconductor device according to claim 24, wherein
the second region made of Si and having a thickness greater than twice the thickness of the first regions is deposited such that the second region comes into contact with the entire exposed portion of the region (1) in the depositing of the second region, and
the NiSi crystalline phase is formed as the second alloy in the converting of the entire region (1) into the region (2) by carrying out the heat treatment in which the second region and the region (1) are heated to a temperature ranging from 350 to 550° C.

27. The method for manufacturing a semiconductor device according to claim 25, wherein
the second region made of Si and having a thickness greater than the thickness of the first regions is deposited such that the second region comes into contact with the entire exposed portion of the region (1) in the depositing of the second region, and
the NiSi crystalline phase is formed as the second alloy in the converting of the entire region (1) into the region (2) by carrying out the heat treatment in which the second region and the region (1) are heated to a temperature ranging from 350 to 550° C.

28. The method for manufacturing a semiconductor device according to claim 24, wherein
the second region made of Si and having a thickness greater than five times the thickness of the first regions is deposited such that the second region comes into contact with the entire exposed portion of the region (1) in the depositing of the second region, and
the $NiSi_2$ crystalline phase is formed as the second alloy in the converting of the entire region (1) into the region (2) by carrying out the heat treatment in which the second region and the region (1) are heated to a temperature ranging from 650 to 800° C.

29. The method for manufacturing a semiconductor device according to claim 25, wherein
the second region made of Si and having a thickness greater than twice the thickness of the first regions is deposited such that the second region comes into contact with the entire exposed portion of the region (1) in the depositing of the second region, and
the $NiSi_2$ crystalline phase is formed as the second alloy in the converting of the entire region (1) into the region (2) by carrying out the heat treatment in which the second region and the region (1) are heated to a temperature ranging from 650 to 800° C.

30. The method for manufacturing a semiconductor device according to claim 2,
wherein the method further comprises the forming of nickel silicide layers on the source/drain regions after the forming of the source/drain regions,
the metal layer is deposited at 450° C. or lower in the depositing of the metal layer,
the second region is deposited at 450° C. or lower in the depositing of the second region, and
the heat treatment is carried out at 450° C. or lower in the converting of the entire first regions into the regions (1) and the converting of the entire region (1) into the region (2).

31. The method for manufacturing a semiconductor device according to claim 30, wherein the second region is deposited by using sputtering in the depositing of the second region.

32. The method for manufacturing a semiconductor device according to claim 2,
wherein the method further comprises the forming of cobalt silicide layers or titanium silicide layers on the source/drain regions after the forming of the source/drain regions,
the metal layer is deposited at 800° C. or lower in the depositing of the metal layer,
the second region is deposited at 800° C. or lower in the depositing of the second region, and
the heat treatment is carried out at 800° C. or lower in the converting of the entire first regions into the regions (1) and the converting of the entire region (1) into the region (2).

* * * * *